United States Patent
Kodama et al.

[19]

[11] Patent Number: 5,998,831
[45] Date of Patent: Dec. 7, 1999

[54] NON-VOLATILE SEMICONDUCTOR MEMORY DEVICE

[75] Inventors: Noriaki Kodama; Kiyokazu Ishige; Atsunori Miki; Toshikatsu Jinbo; Kazuhisa Ninomiya, all of Tokyo, Japan

[73] Assignee: NEC Corporation, Tokyo, Japan

[21] Appl. No.: 08/936,803

[22] Filed: Sep. 24, 1997

[30] Foreign Application Priority Data

Sep. 26, 1996 [JP] Japan ................................. 8-254948

[51] Int. Cl.[6] ............................................... H01L 29/788
[52] U.S. Cl. .................. 257/322; 257/321; 365/185.23; 365/185.24
[58] Field of Search ................................ 257/316, 320, 257/321, 322; 365/185.18, 185.23, 185.24

[56] References Cited

U.S. PATENT DOCUMENTS 5,371,705  12/1994  Nakayama et al. ................ 365/189.09
5,608,670   3/1997  Akaogi et al. ...................... 365/185.23
5,625,591   4/1997  Kato et al. ......................... 365/185.24
5,659,505   8/1997  Kobayashi et al. ................ 365/185.29

FOREIGN PATENT DOCUMENTS 5-182483  7/1993  Japan .
6-37285   2/1994  Japan .
7-235190  9/1995  Japan .

*Primary Examiner*—Mahshid Saadat
*Assistant Examiner*—George C. Eckert, II
*Attorney, Agent, or Firm*—Foley & Lardner

[57] ABSTRACT

A plurality of memory cells are arranged in lattice arrangement to form a memory cell array. Each of the memory cells is provided with a source. Data in the memory cell can be electrically written and erased. Sources of all the memory cells are connected in common. Also, a source voltage control circuit having two or more kinds of load characteristics is connected to the sources connected in common. According to a load characteristics selected from a plurality of load characteristics, source voltage of the memory cell is controlled.

7 Claims, 15 Drawing Sheets

NON-VOLATILE SEMICONDUCTOR MEMORY DEVICE

BACKGROUND OF THE INVENTION

1. Field Of The Invention

The present invention relates to an electrically rewritable non-volatile semiconductor memory device, such as a flash EEPROM or the like.

2. Description Of The Prior Art

A memory cell array consisting of a plurality of memory cells is provided in a non-volatile semiconductor memory device, such as a flash Electrically Erasable and Programmable Read Only Memory (EEPROM) which can electrically rewrite data. Each of the memory cells is formed with a MOSFET. In each of the memory cells, a substrate with a source and a drain on the surface, a control gate electrically insulated from the substrate, and a floating gate formed between the substrate and the control gate are provided. It should be noted that the floating gate is electrically insulated from the substrate and the control gate. Furthermore, the drain, the source and the control gate are connected through wiring.

In such a non-volatile semiconductor memory device, data is stored by charging electron in the floating gate. On the other hand, data is erased by discharging electron from the floating gate. When the electron charged in the floating gate is to be discharged, no voltage is applied to the drain of the memory cell, a voltage of 0V is applied to the control gate of the memory cell, and an electron discharging voltage, e.g. 12V is applied to the source of the memory cell. In such condition, potential of the source of the memory cell becomes much higher than potential of the floating gate to flow the Fowler-Nordheim type tunnel current from the source to the floating gate. Since electron flows in the opposite direction to a flow direction of a current, electron is discharged from the floating gate to the source.

In general, the wiring connected to the source is connected to a source voltage control circuit. The voltage for discharging electron is supplied from the source voltage control circuit. FIG. 1 is a circuit diagram of a conventional source voltage control circuit. The conventional source voltage control circuit is formed with one p-channel MOS transistor. Then, a voltage of 0V is applied to the gate thereof, and a voltage of 12V is supplied to the source. On the other hand, the drain of the p-channel MOS transistor is connected to the sources of the memory cells. FIG. 2 is a graph showing a load characteristics of the conventional source voltage control circuit with taking a voltage output to the source's of the memory cells on the horizontal axis and a current output to the sources on the vertical axis. It should be noted that, in FIG. 2, the solid line represents a load characteristics of the source voltage control circuit, and the broken line represents a source current characteristics of the memory cell. The source current characteristics of the memory cell is determined by the number of electron charged in the floating gate and thus is variable depending on an elapsed time during the discharging electron process, as shown in FIG. 2. Then, the current $I_s$ flowing through the source and the voltage $V_s$ applied to the source of the memory cell in the memory cell array is derived from an intersection of a curve representing the load characteristics of the source voltage control circuit and a curve representing the source current characteristics of the memory cell. Namely, during the discharging electron process, as time elapses the source voltage $V_s$ become elevated and the source current Is become lowered.

On the other hand, during the discharge electron process, since electron is discharged from the floating gate, the potential of the floating gate is also elevated. Comparing speed of elevating of the source voltage $V_s$ of the memory cell and speed of elevating of the potential of the floating gate, the later speed is higher. Accordingly, in the initial stage of the discharging electron process, the highest electric field is applied to a tunnel film existing between the source and the floating gate to flow the largest current in the discharging electron process.

Then, by a high electric field applied initially in the discharging electron process, the tunnel film is depleted to cause bad influence on repetition characteristics of rewriting of data and data holding characteristics after rewriting of data.

Therefore, there has been proposed a non-volatile semiconductor memory device prevented from degradation of characteristics of the memory cell (Japanese Unexamined Patent Publication No. Hei 5-182483). FIG. 3 is a circuit diagram showing a source voltage control circuit disclosed in Japanese Unexamined Patent Publication No. Hei 5-182483. In the source voltage control circuit disclosed in the above-identified publication, a p-channel MOS transistor 101, a depression type n-channel MOS transistor 102 and an n-channel MOS transistor 103 are connected in series. Input terminals, to which input signals are input, are connected to a gate of the p-channel MOS transistor 101 and a gate of the n-channel MOS transistor 103. On the other hand, a gate of the n-channel MOS transistor 102 is connected to a junction 104 between the n-channel MOS transistor 102 and the n-channel MOS transistor 103. Furthermore, sources of memory cells in a memory cell array are also connected to the junction 104. On the other hand, a drain saturated current of the n-channel MOS transistor 102 is set: lower than or equal to a predetermined current.

In the conventional source voltage control circuit constructed as set forth above, since the drain saturated current is set to be lower than or equal to the predetermined current, occurrence of a high electric field in the initial state of the discharge electron process can be prevented. However, the foregoing source voltage control circuit includes the depletion type n-channel MOS transistor whose threshold voltage is lower than or equal to 0V. For fabricating the depletion type n-channel MOS transistor, a step of diffusing impurity to a channel region is required. Accordingly, greater number of photoresists become necessary for fabrication of such a depletion type n-channel MOS transistor in comparison with an enhanced type n-channel MOS transistor and a p-channel MOS transistor, and thus greater number of process steps are required.

On the other hand, there has been also proposed a non-volatile semiconductor memory device having a source voltage control circuit which controls rising period of a voltage applied to sources of memory cells (Japanese Unexamined Patent Publication No. Hei 6-37285). FIG. 4 is a circuit diagram showing a source voltage control circuit disclosed in the above-identified Japanese Unexamined Patent Publication No. Hei 6-37285. In the disclosed source voltage control circuit, a boosting circuit 201 converting an erasure signal into a gradually rising voltage and an output circuit 202 outputting a voltage output from the boosting circuit 201 to sources of memory cells in memory cell array are provided. In the boosting circuit 201, a gate of an n-channel MOS transistor 201b and an input terminal of an inverter 201c are connected to an input terminal, to which the erasure signal is input. Ai gate of a n-channel MOS transistor 201e is connected to an output terminal of the inverter 201c. A drain of a p-channel MOS transistor 201a is connected to a drain of the n-channel MOS transistor 201b. Also, respective gates of a p-channel MOS transistor 201d, an n-channel MOS transistor 201h and an n-channel MOS transistor 201q are connected to the drain of the n-channel MOS transistor 201b. A drain of the n-channel MOS transistor 201e is connected to a gate of the p-channel MOS transistor 201a, a gate of an n-channel MOS transistor 201f and a drain of the p-channel MOS transistor 201d. A source of a p-channel MOS transistor 201g and a source of an n-channel MOS transistor 201i are connected to a drain of the n-channel MOS transistor 201f. A drain of the p-channel MOS transistor 201g is connected to a drain of the n-channel MOS transistor 201h. One terminal of a capacitor 201l is connected to the source of the n-channel MOS transistor 201i. An input terminal of an inverter 201k is connected to the other terminal of the capacitor 201l. It should be noted that an oscillation signal OSC is supplied to the inverter 201k. One terminal of a capacitor 201m is connected to an output terminal of the inverter 201k. A drain of the n-channel MOS transistor 201i is connected to the other terminal of the capacitor 201m. Also, a source of an n-channel MOS transistor 201j is connected to the drain of the n-channel MOS transistor 201i. A gate of the n-channel MOS transistor 201i is connected to its own source. A gate of the n-channel MOS transistor 201j is connected to its own source. A p-channel MOS transistor 201p, an n-channel MOS transistor 201o and an n-channel MOS transistor 201n are connected to an n-channel MOS transistor 201q in series in sequential order. It should be noted that a voltage $V_{pp}$ is supplied to a source of the n-channel MOS transistor 201n. A gate of the n-channel MOS transistor 201n is connected to its own source. Also, a gate of the n-channel MOS transistor 201o is connected to its own source. Similarly, a gate of the p-channel MOS transistor 201p is connected to its own source. On the other hand, a drain of the n-channel MOS transistor 201j and the output circuit 202 are connected to a junction between the source of the n-channel MOS transistor 201o and the p-channel MOS transistor 201p. It should be noted that the voltage $V_{pp}$ is supplied to the source of the p-channel MOS transistor 201a, the source of the n-channel MOS transistor 201d, the drain of the n-channel MOS transistor 201f and the source of the n-channel MOS transistor 201n. On the other hand, a power source voltage $V_{cc}$ is supplied to the gate of the p-channel MOS transistor 201g and the gate of the p-channel MOS transistor 201p.

On the other hand, in the output circuit 202, a source of a p-channel MOS transistor 202a and a drain of an n-channel MOS transistor 202c is connected to an input terminal, to which the signal output from the boosting circuit 201 is input. An input terminal of an inverter 202b is connected to a drain of the p-channel MOS transistor 202a. A gate of an n-channel MOS transistor 202d is connected to an output terminal of the inverter 202b. A source of the n-channel MOS transistor 202c and a source of the n-channel MOS transistor 202d are connected to sources of memory cells in a memory cell array. On the other hand, the voltage $V_{pp}$ is supplied to a drain of the n-channel MOS transistor 202c. Also, the power source voltage $V_{cc}$ is supplied to a gate of the p-channel MOS transistor 202a.

In the conventional source voltage control circuit constructed as set forth above, when the erasure signal is input the boosting circuit 201, the erasure signal is gradually propagated among the respective transistors and converted into a voltage. Then, the voltage is output to the output circuit 202. In the output circuit 202, the voltage output from the boosting circuit 201 is gradually risen up to the voltage $V_{pp}$ to be output to the sources in the memory cell array. However, the voltage per se in the initial stage of the discharging electron process is not lowered. Therefore, since a high electric field is applied to a tunnel film to cause fatigue of the tunnel film.

Furthermore, there has been proposed a non-volatile semiconductor memory device having means for transiting a threshold voltage to a targeted value from the value on writing in two stages in order to suppress a large current flowing between a source and a substrate (Japanese Unexamined Patent Publication No. Hei 7-235190). In a non-volatile semiconductor memory device disclosed in the above-identified publication, by applying an even voltage to sources of memory cells in two stages, a threshold value of the memory cells transits in two stages. However, in the initial stage of the discharging electron process, the problem that a high electric field is applied to the tunnel film is held unsolved. Furthermore, as can be appreciated from consideration of the source current characteristics of the memory cell and so forth, it is difficult to apply the even voltage to the source of the memory cell within a certain period. However, nothing has been mentioned about load characteristics of the source voltage control circuit and the source current characteristics of the memory cell. Therefore, implementation of the non-volatile semiconductor memory device is impossible.

SUMMARY OF THE INVENTION

It is an object of the present invention to provide a non-volatile semiconductor memory device which can avoid fatigue of tunnel film by weakening electric field applied to the tunnel film in initial stage of the discharging electron process for erasing data and can be fabricated with lesser number of process steps.

According to the first aspect of the invention, a non-volatile semiconductor memory device includes a memory cell which has a control gate, a floating gate, an insulating film insulating between the control gate and the floating gate, a source, and a tunnel film insulating between the floating gate and the source. In the memory cell, data is to be stored by charging electron in the floating gate. On the other hand, data is to be erased from the memory cell by discharging electron charged in the floating gate. Also, the non-volatile semiconductor memory device includes a source voltage control circuit, connected to the source, and having a plurality of load characteristics. A voltage of the source is controlled by selecting specific load characteristics from a plurality of the load characteristics when electron charged in the floating gate is discharged.

In the present invention, a plurality of load characteristics are provided in the source voltage control circuit controlling the source voltage of the memory cell. on the basis of the load characteristics, the source voltage of the memory cell is determined. Accordingly, by selecting specific load characteristics, an electric field to be exerted at initial stage of a discharge electron process for erasing data can be weakened to prevent fatigue of the tunnel film.

According to another aspect of the invention, a non-volatile semiconductor memory device has a memory cell, which includes a control gate, a floating gate, an insulating film insulating between the control gate and the floating gate, a source, and a tunnel film insulating between the floating gate and the source. In the memory cell data is to be stored by charging electron in the floating gate. On the other hand, data is to be erased from the memory cell by discharging electron charged in the floating gate. Also, non-volatile semiconductor device includes a source voltage control circuit connected to the source. Furthermore, a first p-channel MOS transistor having a gate is provided in the source voltage control circuit. A signal indicating whether electron charged in the floating gate of the memory cell is to be discharged or not is input. A second p-channel MOS transistor having a gate is connected to the first p-channel MOS transistor in series. A gate control circuit applying a voltage between a grounding potential and a power source voltage to the gate of the second p-channel MOS transistor is provided in the source voltage control circuit. On the other hand, no depletion type n-channel MOS transistor is provide in the source voltage control circuit.

In the present invention, in the source voltage control circuit controlling the source voltage of the memory cell, the first p-channel MOS transistor and the second p-channel MOS transistor mutually connected in series are provided. A voltage of the gate of the second p-channel MOS transistor is controlled by the gate voltage control circuit. Therefore, the current flowing through the source of the memory cell becomes substantially constant through out the discharging electron process from the initial stage to the latter stages, Thus, the electric field can be weakened to be applied to the tunnel film at the initial stage of discharge electron from the floating gate. Therefore, fatigue of the tunnel film can be prevented. It should be noted that, since no deletion type n-channel MOS transistor is provided, the fabrication process steps for fabricating the non-volatile semiconductor memory according to the present invention can be smaller in number in comparison with that for the prior art.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscuring the present invention.

Figure 1:
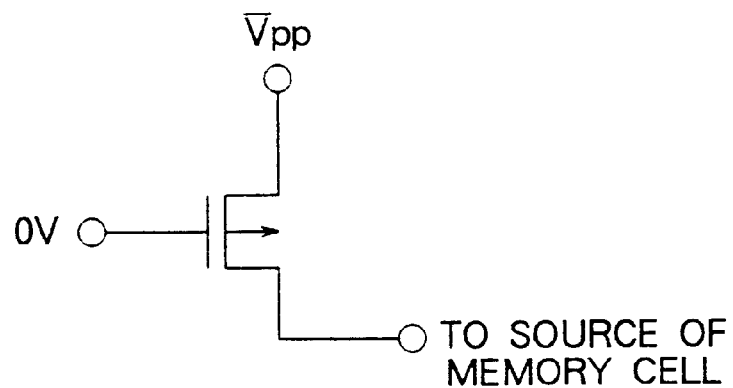
FIG. 1 is a circuit diagram showing a conventional source voltage control circuit.
Figure 2:
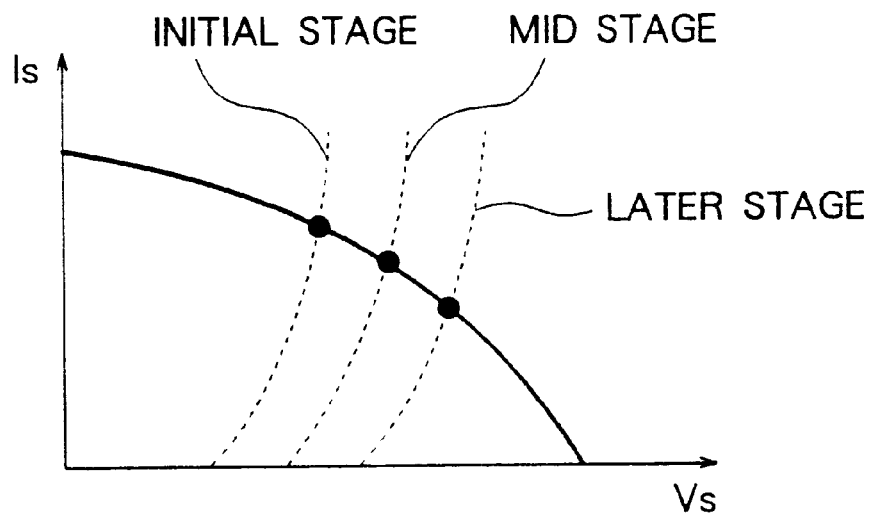
FIG. 2 is a graph showing a load characteristics of the conventional source voltage control circuit.
Figure 3:
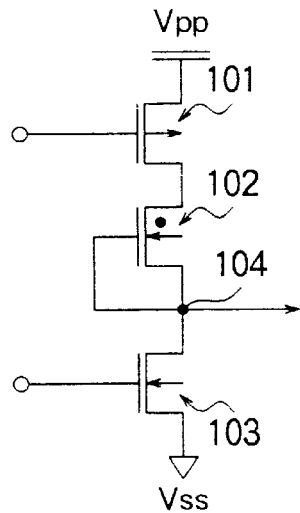
FIG. 3 is a circuit diagram showing a source voltage control circuit disclosed in Japanese Unexamined Patent Publication No. Hei 5-182483.
Figure 4:
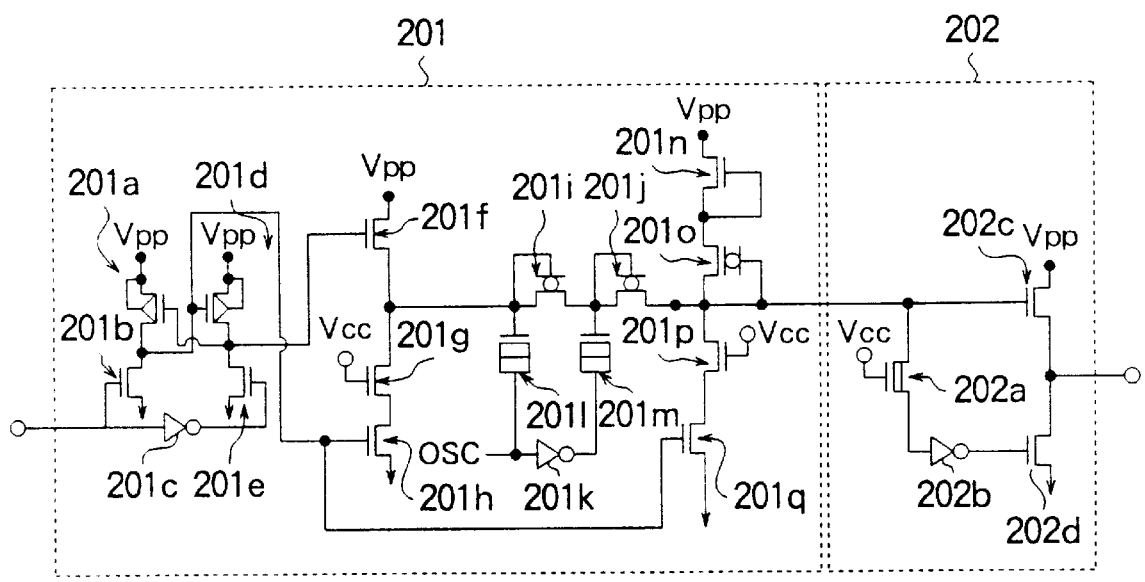
FIG. 4 is a circuit diagram showing a source voltage control circuit disclosed in Japanese Unexamined Patent Publication No. Hei 6-37285.
Figure 5:
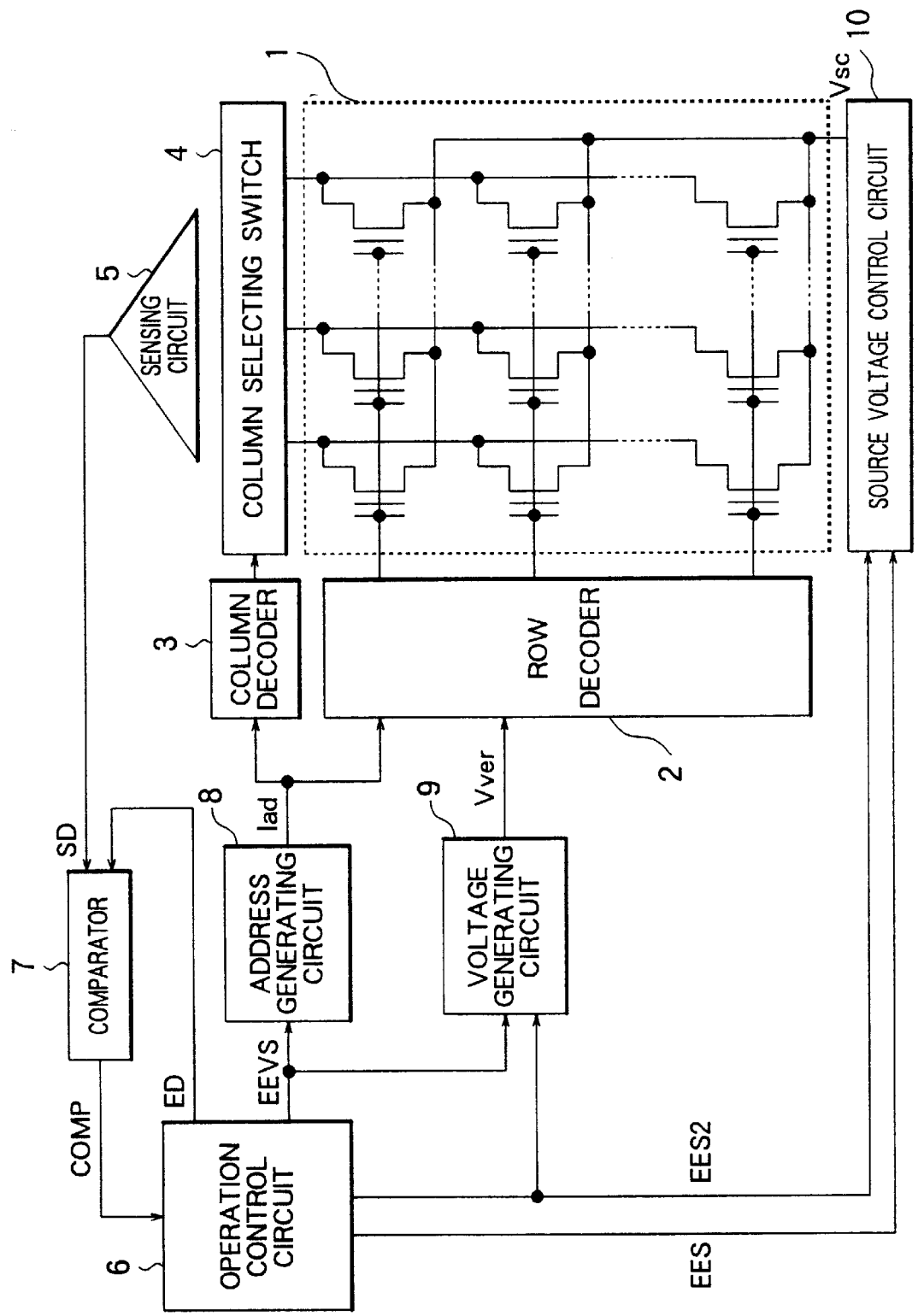
FIG. 5 is a block diagram showing the first embodiment of a non-volatile semiconductor memory device according to the present invention.

FIG. 5 is a block diagram of the first embodiment of a non-volatile semiconductor memory device according to the present invention. In the shown embodiment, a memory cell array 1 is provided, in which a plurality of memory cells are arranged in lattice arrangement. In each of the memory cells, a control gate and a floating gate are provided. An insulation film is provided between the control gate and the floating gate. On the other hand, a source and a drain are provided in each of the memory cells. Between the source and the drain, and the floating gate, an insulative tunnel film is disposed. Then, data is stored by charging electron in the floating gate, and data is erased by discharging electron from the floating gate. It should be noted that the control gates of a predetermined number of memory cells forming each row are connected in common. On the other hand, the drains of a predetermined number of memory cells forming each column are also contacted in common. Furthermore, the sources of all the memory cells are connected in common.

A row decoder 2 is connected to the control gates of the memory cells connected in common. On the other hand, a column selecting switch 4 is connected to the drains of the memory cells connected in common. Furthermore, a source voltage control circuit 10 having two kinds of load characteristics is connected to the sources of the memory cells connected in common.

On the other hand, a column decoder 3 is connected to the column selecting switch 4. A voltage generating circuit 9 generating a verification voltage is connected to the row decoder 2. Also, an address generating circuit 8 generating an internal address is connected to the row decoder 2 and the column decoder 3. An operation control circuit 6 controlling operation for discharging electron is connected to the address generating circuit 8, the voltage generating circuit 9 and the source voltage control circuit 10. The operation control circuit 6 and the source voltage control circuit 10 are connected with two lines of wiring. One of the two lines is branched at the intermediate position and connected to the voltage generating circuit 9.

On the other hand, a comparator 7 is connected to the operation control circuit 6 with two lines of wiring. Furthermore, a sensing circuit 5 detecting data of the memory cells in the memory cell array 1 is connected to the comparator 7.

Next, operation for discharging electron charged in the memory cells in the memory cell array 1 is explained in the non-volatile semiconductor memory device constructed as set forth above. In the shown embodiment, the electron is discharged in two stages.

First, an electron discharge signal EES for controlling a voltage supplied to the sources of the memory cells in the first stage of the discharging electron process is output from the operation control circuit 6 to the source voltage control circuit 10. Next, a first load characteristics of the source voltage control circuit 10 used in the first stage of the discharging electron process is selected according to the electron discharge signal EES. Then, a control voltage $V_{SC}$ controlling source voltage is supplied from the source voltage control circuit 10 to the sources of all the memory cells. Thus, a predetermined number of electron among electron charged in the memory cells is discharged.

Next, a verification signal EEVS for verifying whether or not the predetermined number of electron is discharged from the predetermined memory cells is output from the operation control circuit 6 to the address generating circuit 8 and the voltage generating circuit 9. Then, the internal address $I_{ad}$ designating memory cells to be verified is generated according to the verification signal EEVS in the address generating circuit 8 and is output to the row decoder 2 and the column decoder 3. At this time, a verification voltage $V_{ver}$ for making judgment, based on the thresholds of the memory cells, whether or not the predetermined number of electron is discharged from the predetermined memory cells is generated in the voltage generating circuit 9 according to the verification signal EEVS, and is output to the row decoder 2. The verification voltage $V_{ver}$ is 5V, for example.

Next, the verification voltage $V_{ver}$ is supplied to the control gates of all the memory cells positioned in rows designated by the internal address $I_{ad}$. At this time, columns to be selected by the column selecting switch 4 are selected by the column decoder 3 according to the internal address $I_{ad}$.

Next, data of the memory cells located in the columns selected by the column selecting switch 4 is detected by the sensing circuit 5 on the basis of the thresholds thereof among the memory cells positioned in the rows, to which the verification voltage $V_{ver}$ is supplied from the row decoder 2. Also, the data is amplified by the sensing circuit 5 and output to the comparator 7 as a cell reading data SD. On the other hand, an expected value data ED after the discharging electron process in the first stage, is output from the operation control circuit 6 to the comparator 7.

Next, the cell reading data SD and the expected value data ED are compared by the comparator 7. Then, a result of the comparison in the comparator 7 is output to the operation control circuit 6 as a comparison result signal COMP. Then, judgment is made whether discharging electron in the first stage is passed in all the memory cells, by the operation control circuit 6. When judgment is made that discharging electron is not passed in all the memory cells, the electron discharge signal EES is again output from the operation control circuit 6 to the source voltage control circuit 10. The foregoing operation is repeated until judgment is made that discharging electron is passed in all the memory cells.

Once judgment is made that discharging electron is passed in all the memory cells, the electron discharge signal EES is output from the operation control circuit 6 to the source voltage control circuit 10, and an electron discharge signal EES2 is output from the operation control circuit 6 to the source voltage control circuit 10 and the voltage generating circuit 9. Then, a second load characteristics of the source voltage control circuit 10 used in the second stage of the discharging electron process is selected according to the electron discharge signals EES and EES2. Then, a control voltage $V_{SC}$ controlling the source voltage is supplied from the source voltage control circuit 10 to the sources of all the memory cells. Thus, electron charged in the memory cells is discharged.

Hereinafter, similarly to the first stage of the discharging electron process, electron is discharged in the second stage until discharging electron are passed in all the memory cells. Here, the verification voltage $V_{ver}$ in the second stage of the discharging electron process is lower than that in the first stage, e.g. 3V.

Figure 6:
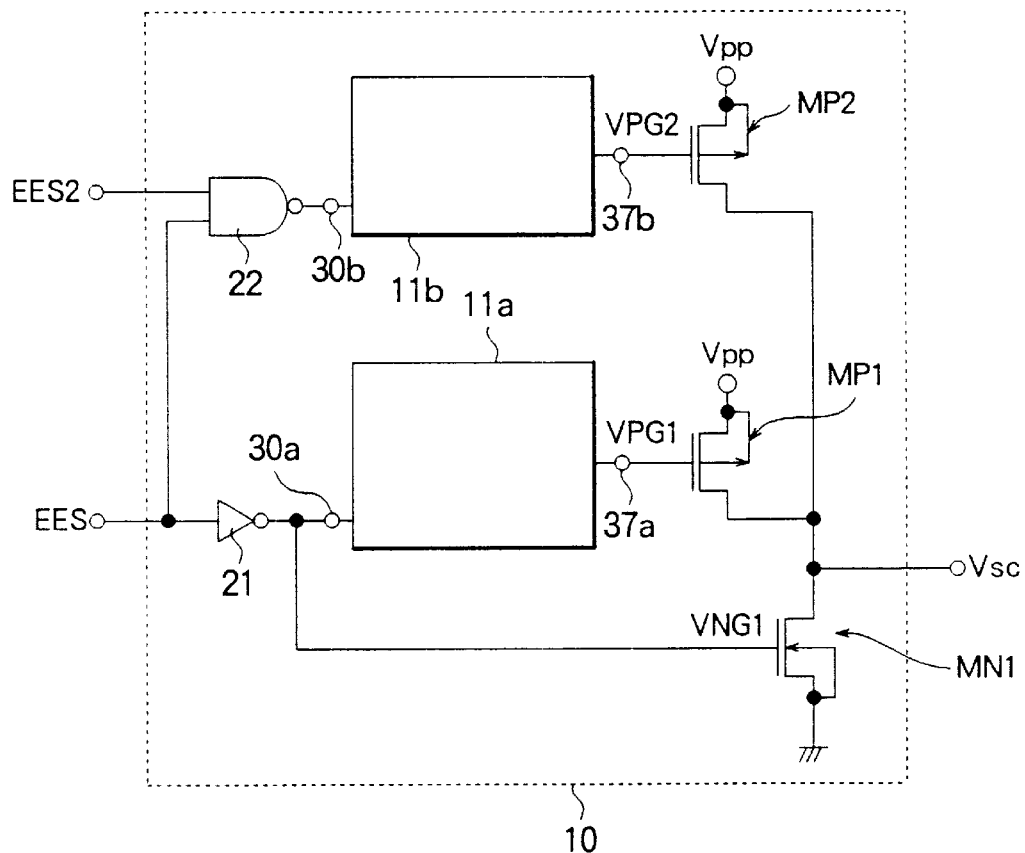
FIG. 6 is a circuit diagram showing the source voltage control circuit provided in the first embodiment of the non-volatile semiconductor memory device.

Next, the source voltage control circuit 10 provided in the foregoing non-volatile semiconductor memory device will be discussed hereinafter. FIG. 6 is a circuit diagram showing the source voltage control circuit provided in the first embodiment. In the source voltage control circuit 10, a NOT circuit 21 and a NAND circuit 22 are provided. An input terminal of the NOT circuit 21 is connected to a terminal, to which the electron discharge signal EES is input. An input terminal of the NAND circuit 22 is connected to the terminal, to which the electron discharge signal EES is input, and a terminal, to which the electron discharge signal EES2 is input. Then, the input terminal 30a of a level shifter circuit 11a is connected to an output terminal of the NOT circuit 21. Also, an input terminal 30b of a level shifter circuit 11b is connected to an output terminal of the NAND circuit 22.

Figure 7:
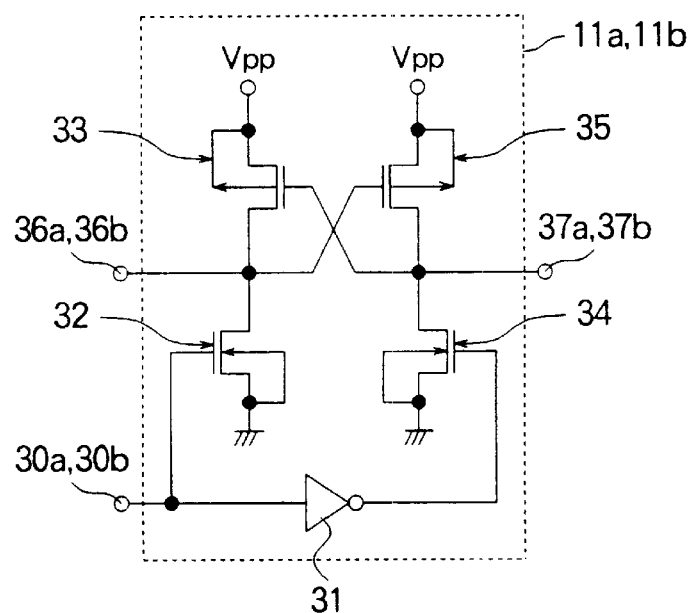
FIG. 7 is a circuit diagram showing the level shifter circuit provided in a non-volatile semiconductor memory device according to the present invention.

FIG. 7 is a circuit diagram showing the level shifter circuit provided in the source voltage control circuit. In the level shifter circuit 11a and 11b, an input terminal of a NOT circuit 31 and a gate of an n-channel MOS transistor 32 are connected to an input terminal 30a or 30b, respectively. A source of the n-channel MOS transistor 32 is grounded. On the other hand, a drain of a p-channel MOS transistor 33, a gate of a p-channel MOS transistor 35 and a second output terminal 36a or 36b are connected to a drain of the n-channel MOS transistor 32. A gate of an n-channel MOS transistor 34 is connected to an output terminal of the NOT circuit 31. A source of the n-channel MOS transistor 34 is grounded. A gate of the p-channel MOS transistor 33, a drain of the p-channel MOS transistor 35 and a first output terminal 37a or 37b are connected to a drain of the n-channel MOS transistor 34. Furthermore, a power source voltage $V_{pp}$ is supplied to the respective p-channel MOS transistors 33 and 35.

In the level shifter circuit 11a and 11b, an output voltage level is variable with respect to the input signals input to the input terminal 30a or 30b. A voltage varying similarly to the input signal, which is input to the input terminal 30a or 30b, is output from the first input terminal 37a or 37b. On the other hand, a voltage, varying similarly to an inverted signal of the input signal which is input to the input terminal 30a or 30b, is output from the second output terminal 36a or 36b.

As shown in FIG. 6, in the source voltage control circuit 10 provided in the first embodiment of the non-volatile semiconductor memory device, a gate of a p-channel MOS transistor MP1 is connected to the first input terminal 37a connected to the level shifter circuit 11a. On the other hand, a gate of a p-channel MOS transistor MP2 is connected to the first output terminal 37b connected to the level shifter circuit 11b. Then, respective sources of the p-channel MOS transistors MP1 and MP2 are supplied with the power source voltage $V_{pp}$. A gate of an n-channel MOS transistor MN1 is connected to the output terminal of the NOT circuit 21. A source of the n-channel MOS transistor MN1 is grounded, and a drain thereof is connected to respective drains of the p-channel MOS transistors MP1 and MP2 in common. Furthermore, the respective drains of the p-channel MOS transistors MP1 and MP2 are connected to a terminal, from which the control voltage $V_{SC}$ is output.

Figure 8:
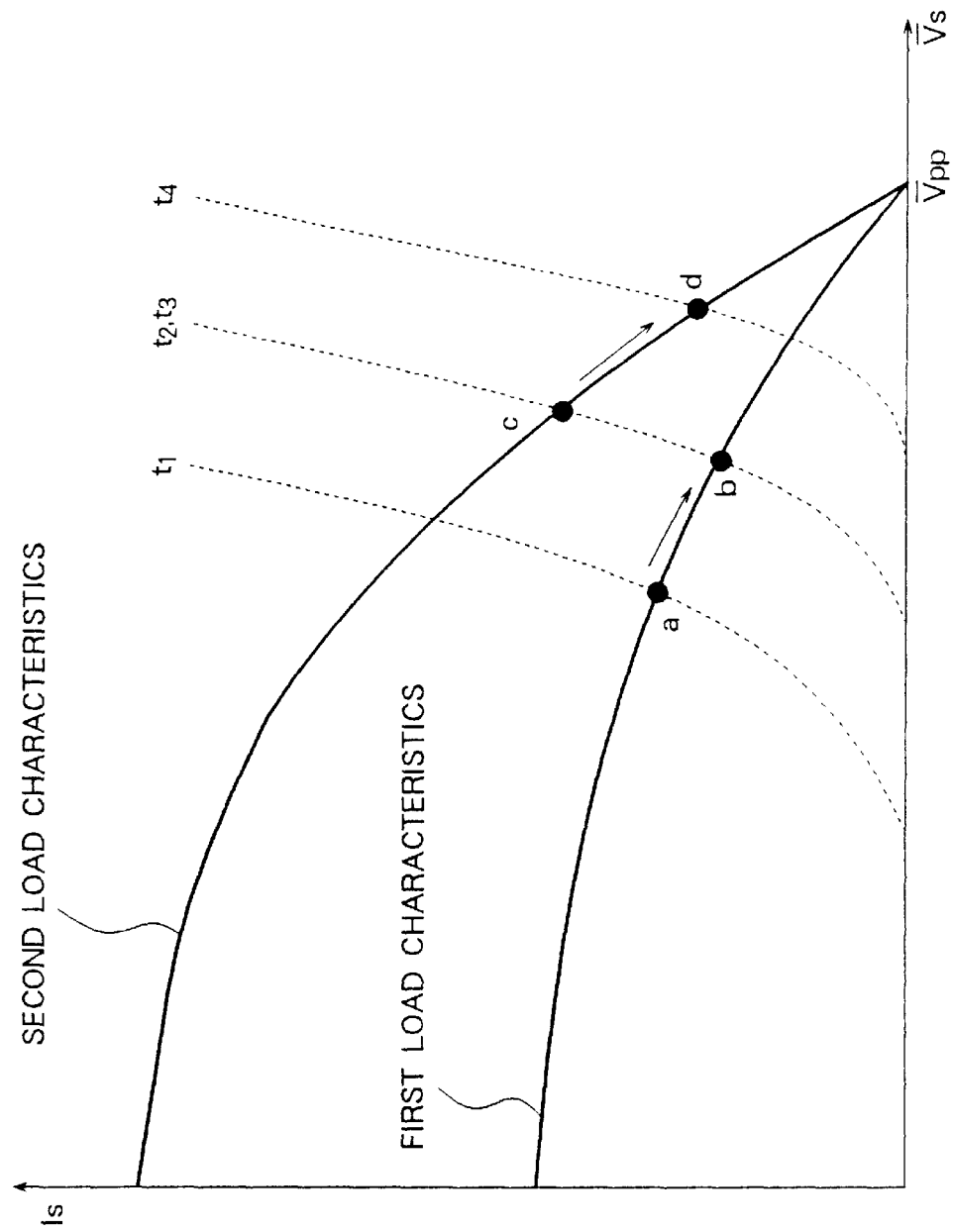
FIG. 8 is a graph showing the load characteristics of the source voltage control circuit provided in the first embodiment of the non-volatile semiconductor memory device.

In the source voltage control circuit 10 constructed as set forth above, when the electron discharge signal EES is input, only the p-channel MOS transistor MP1 is turned ON. Then, the first load characteristics appears. On the other hand, when the electron discharge signals EES and EES2 are input, both of the p-channel MOS transistors MP1 and MP2 are turned ON. Then, the second load characteristics appears. At this time, voltages to be applied to the respective gates of the p-channel MOS transistors MP1 and MP2 are controlled by the level shifter circuits 11a and 11b. Thus, the level shifter circuits 11a and 11b have a function as a gate voltage control circuit. FIG. 8 is a graph showing the load characteristics of the source voltage control circuit provided in the first embodiment with taking a voltage output to the respective sources of the memory cells on the horizontal axis and a current output to the sources on the vertical axis. In FIG. 8, the solid line represents the load characteristics of the source voltage control circuit 10, and the broken line represents a source current characteristics of the memory cell. In FIG. 8, a current actually flowing through the sources of the memory cells and their voltages are derived from the intersection of a curve showing the load. characteristics of the source voltage control circuit and a curve showing the source current characteristics of the memory cell. In the shown embodiment, the second load characteristics is similar to the load characteristics of the conventional source voltage control circuit, and the current of the first load characteristics is lowered at the same voltage than that of the second load characteristics. Accordingly, when the first load characteristics is selected, the current flowing through the tunnel film becomes smaller.

Figure 9:
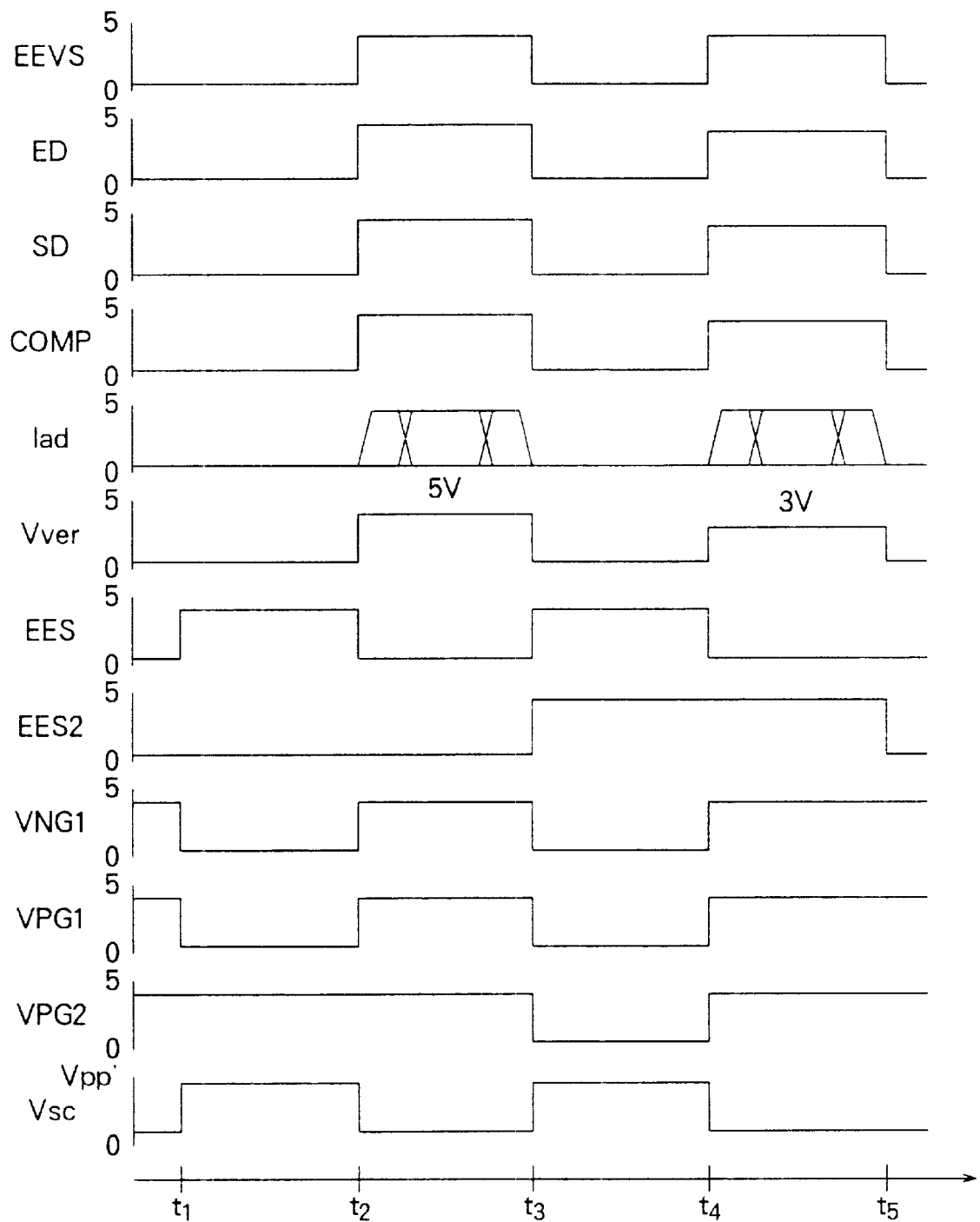
FIG. 9 is a timing chart showing the operation of the first embodiment of the non-volatile semiconductor memory device.

Next, discussion will be given for operation of the source voltage control circuit with reference to an accompanied timing chart. FIG. 9 is a timing chart showing the operation of the first embodiment of the non-volatile semiconductor memory device. Before a time $t_1$, at which the first stage of the discharging electron process is to be initiated, a gate voltage VPG1 of the p-channel MOS transistor MP1, a gate voltage VPG2 of the p-channel MOS transistor MP2 and a gate voltage VNG1 of the n-channel MOS transistor MN1 are 5V, respectively.

Then, at the time $t_1$, the electron discharge signal EES of 5V is output from the operation control circuit 6 to the source voltage control circuit 10. Then, the gate voltages VNG1 and VPG1 becomes 0V, only the p-channel MOS transistor MP1 is turned ON. Then, the power source voltage $V_{PP}$ as the control voltage $V_{SC}$ is output from the source voltage control circuit 10. It should be noted that, at this time, the load characteristics of the source voltage control circuit 10 is the first load characteristics. The source voltage of the memory cell is derived from an intersection a of the curve showing the first load characteristics and the curve representing the source current characteristics of the memory cell. Subsequently, associating with discharging electron in the floating gate, the source current characteristics is varied. According to this, the source voltage is gradually risen, as shown in FIG. 8.

Next, at a time $t_2$, at which the verification is to be initiated whether or not discharging electron in the first stage is passed in all the memory cells, the verification signal EEVS of 5V is output from the operation control circuit 6. Then, the internal address $I_{ad}$ of 5V is output from the address generating circuit 8, and the verification voltage $V_{ver}$ of 5V is output from the voltage generating circuit 9. On the other hand, the voltage of the electron discharge signal EES becomes 0V. Then, the gate voltages VNG1 and VPG1 become 5V again. At this time, the control voltage $V_{SC}$ becomes 0V. It should be noted that the source voltage of the memory cell is derived from the intersection b in FIG. 8. Also, the cell reading data SD of 5V is output from the sensing circuit 5, the expected value data ED of 5V is output from the operation control circuit 6, and the comparison result signal COMP of 5V is output from the comparator 7. Here, it is assumed that discharging electron in the first stage is passed in all the memory cells. If discharging electron in the first stage is not passed in all the memory cells, the process from the time $t_1$ is repeated.

Next, at a time $t_3$, at which discharging electron in the second stage is to be initiated, the verification voltage EEVS becomes 0V. Then, the respective voltages of the internal address $I_{ad}$ and the verification voltage $V_{ver}$ become 0V. On the other hand, the electron discharge signals EES and EES2 of 5V are output from the operation control circuit 6. Then, the gate voltages VNG1, VPG1 and VPG2 become 0V to turn the p-channel MOS transistors MP1 and MP2 ON. Then, the voltage $V_{PP}$, as the control voltage $V_{SC}$, is output from the source voltage control circuit 10. It should be noted that the load characteristics at this time is the second load characteristics, and the source voltage of the memory cell is derived from an intersection c of the curve representing the second load characteristics and the curve representing the source current characteristics of the memory cell. Subsequently, associating with discharging electron in the floating gate, the source current characteristics is varied. According to variation of the source current characteristics, the source voltage is gradually risen as shown in FIG. 8. It should be noted that the voltages of the cell reading data SD, the expected value data ED and the comparison result signal COMP become 0V, respectively.

Next, at a time $t_4$, at which the verification is to be initiated whether or not discharging electron in the second stage is passed in all the memory cells, the voltage is output from each circuit, similar to the verification whether discharging electron in the first stage is passed, except for the voltage of the electron discharge signal EES2 being held at 5V. It should be noted that the source voltage of the memory cell at this time is derived from an intersection d in FIG. 8. On the other hand, the verification voltage $V_{ver}$ output from the voltage generating circuit 9 is lower than that in the first stage of the discharging electron process, i.e. 3V.

Then, at a time $t_5$, at which the verification is to be terminated, the voltage of each circuit becomes similar to that before the time $t_1$. When discharging electron is passed in all the memory cells, the operation goes end, and otherwise, the process from the time $t_3$ is repeated.

In the shown embodiment, since two kinds of load characteristics are provided in the source voltage control circuit, the source voltage of the memory cell during a term from ti to $t_2$ is determined on the basis of the first load characteristics. At this time, the source voltage is as illustrated from a zone a to b in FIG. 8. On the other hand, the source voltage of the memory cell during a term from $t_3$ to $t_4$ is determined on the basis of the second load characteristics. At this time, the source voltage is as illustrated from a zone c to d in FIG. 8. Accordingly, a current flowing through the respective sources of the memory cells during the term from $t_1$ to $t_2$ is smaller than that during the term from $t_3$ to $t_4$. Thus, at the initial stage of the discharging electron process, an electric field to be applied to the tunnel film becomes lower to restrict fatigue of the tunnel film.

It should be noted that while two kinds of load characteristics are provided in the source voltage control circuit 10 in the shown embodiment, greater number of the load characteristics may be provided in the similar principle. For example, when four kinds of load characteristics are provided, four p-channel MOS transistors may be connected in parallel. Thus, the voltage to be applied to the source of the memory cell can be set more strictly.

On the other hand, respective sizes of the p-channel MOS transistors MP1 and MP2 are not specified. Both of the p-channel MOS transistors may be the same or different. Relationship between two load characteristics of the source voltage control circuit 10 can be adjusted by adjusting the sizes of the transistors. By this, a voltage to be applied to the source of the memory cell can be adjusted.

Figure 10:
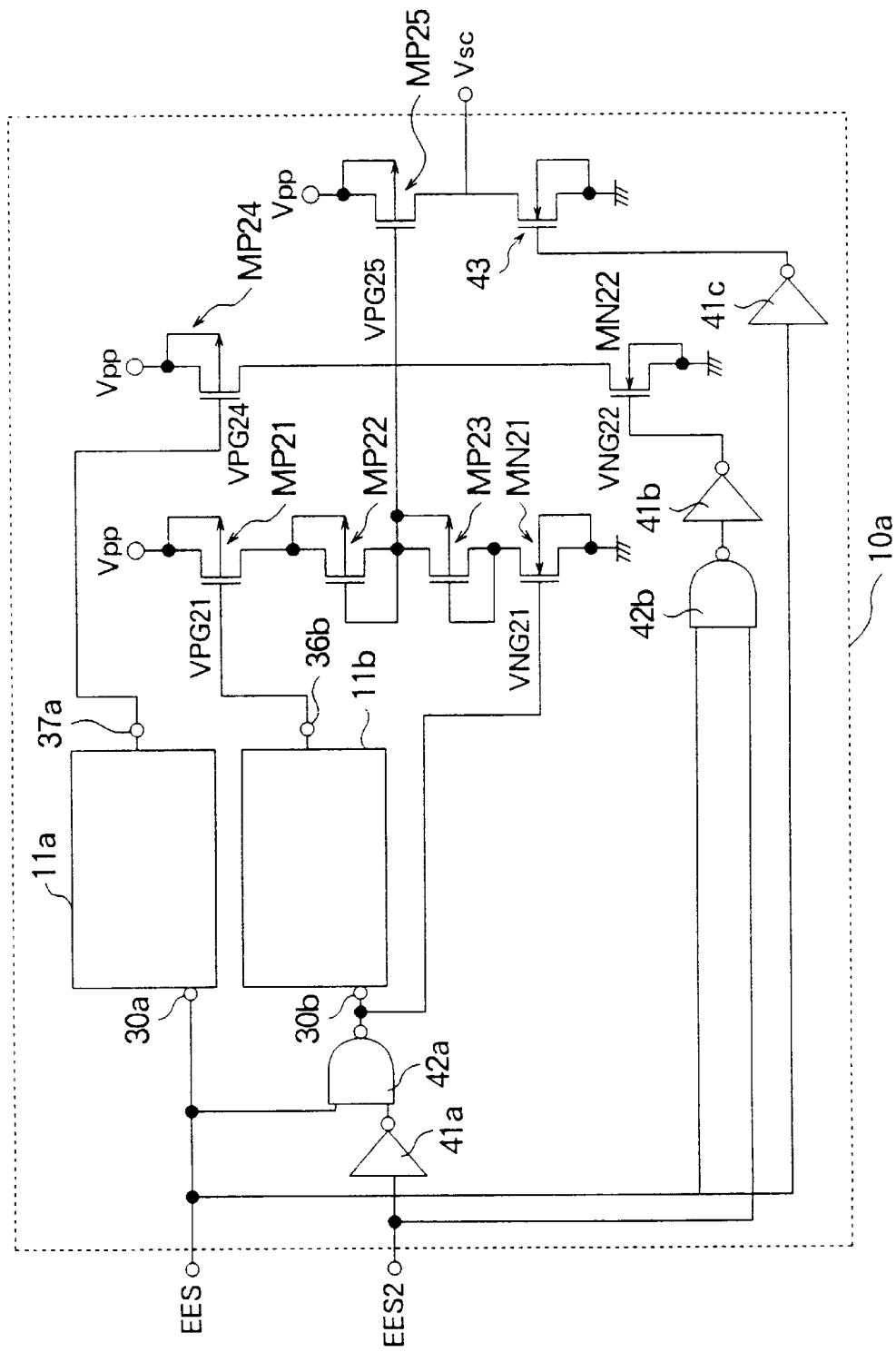
FIG. 10 is a circuit diagram showing the source voltage control circuit provided in the second embodiment of a non-volatile semiconductor memory device according to the present invention.

Next, the second embodiment of a non-volatile semiconductor memory device according to the present invention will be discussed. In the second embodiment, the construction except for the source voltage control circuit is the same as the first embodiment. Thus, discussion for the common elements will be neglected for keeping the disclosure simple enough to facilitate clear understanding of the present invention. FIG. 10 is a circuit diagram showing the source voltage control circuit provided in the second embodiment of the non-volatile semiconductor memory device according to the present invention. In a source voltage control circuit 10a provided in the second embodiment, a NOT circuit 41a and a NAND circuit 42a are provided. An input terminal of the NOT circuit 41a is connected to a terminal, to which the electron discharge signal EES2 is input. Input terminals of the NAND circuit 42a are connected to a terminal, to which the electron discharge signal EES is input, and an output terminal of the NOT circuit 41a. Then, the input terminal 30b of the level shifter circuit 11b is connected to an output terminal of the NAND circuit 42a. Also, the input terminal 30a of the level shifter circuit 11a is connected to the terminal, to which the electron discharge signal EES is input.

A gate of a p-channel MOS transistor MP24 is connected to the first output terminal 37a of the level shifter circuit 11a.

On the other hand, a gate of the p-channel MOS transistor MP21 is connected to the second output terminal 36b of the level shifter circuit 11b. Then, the power source voltage $V_{PP}$ is supplied to a source of the p-channel MOS transistor MP21. Also, a source of the p-channel MOS transistor MP22 is connected to a drain of the p-channel MOS transistor MP21. A gate and a drain of the p-channel MOS transistor MP22 are connected to each other. A source of the p-channel MOS transistor MP23 is connected to the drain of the p-channel MOS transistor MP22. A drain of an n-channel MOS transistor MN21 is connected to a gate and a drain of the p-channel MOS transistor MP23. A source of the n-channel MOS transistor MN21 is grounded. Furthermore, a gate of the n-channel MOS transistor MN21 is connected to the output terminal of the NAND circuit 42a.

Input terminals of a NAND circuit 42b are connected to the terminal, to which the electron discharge signal EES is input, and the terminal, to which the electron discharge signal EES2 is input. Then, an input terminal of a NOT circuit 41b is connected to an output terminal of the NAND circuit 42b. A gate of an n-channel MOS transistor MN22 is connected to a output terminal of the NOT circuit 41b. Then, a source of the n-channel MOS transistor MN22 is grounded. Furthermore, a gate of a p-channel MOS transistor MP25 is connected to a drain of the p-channel MOS transistor MP24, a drain of the p-channel MOS transistor MP22, a well of the p-channel MOS transistor MP23 and a drain of the n-channel MOS transistor MN22. It should be noted that the power source voltage $V_{PP}$ is supplied to a source of the p-channel MOS transistor MP24.

Also, an input terminal of a NOT circuit 41c is connected to the terminal, to which the electron discharge signal EES is input. Then, a gate of an n-channel MOS transistor 43 is connected to an output terminal of the NOT circuit 41c. A source of the n-channel MOS transistor 43 is grounded. On the other hand, a drain of the n-channel MOS transistor 43 and a drain of the p-channel MOS transistor MP25 are connected to a terminal, from which the control voltage $V_{SC}$ is output.

In the source voltage control circuit 10a constructed as set forth above, also, two kinds of load characteristics are provided. On the other hand, the voltage to be applied to the gate of the p-channel MOS transistor MP25 is controlled by the level shifter circuits 11a and 11b. Thus, even in the shown embodiment, also, the level shifter circuits 11a and 11b have a function as the gate voltage control circuit.

Figure 11:
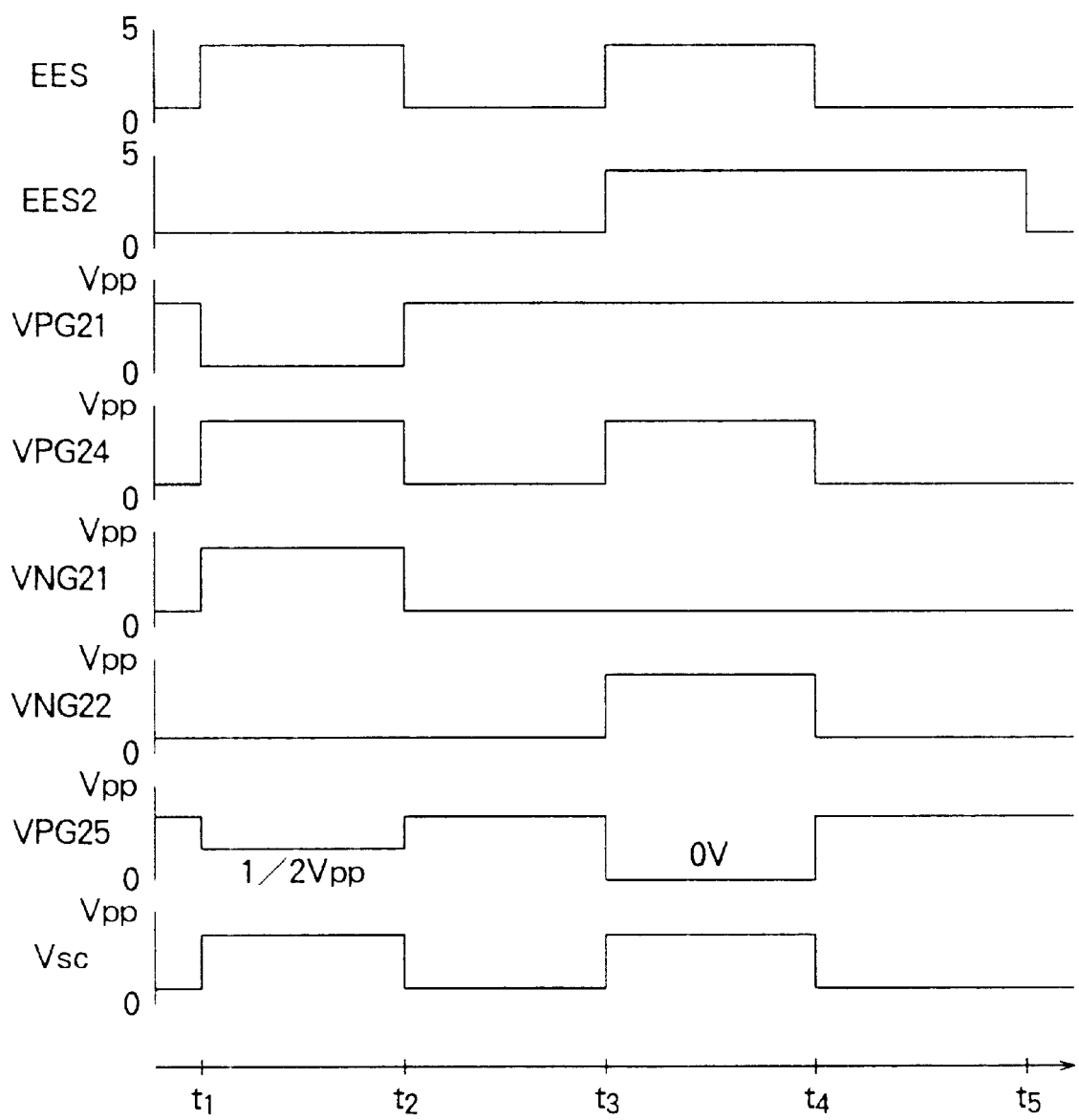
FIG. 11 is a timing chart showing the operation of the second embodiment of the non-volatile semiconductor memory device.

Next, with reference to an attached timing chart, discussion will be given for operation of the shown embodiment of the source voltage control circuit. FIG. 11 is a timing chart showing operation of the second embodiment of the non-volatile semiconductor memory device according to the present invention. It should be noted that each operation of the collation signal EEVS, the expected value data ED, the cell reading data SD, the comparison result signal COMP, the internal address $I_{ad}$ and the collation voltage $V_{ver}$ is similar to the first embodiment. Thus, discussion therefor will be neglected. First, before a time $t_1$, at which the first stage of the discharging electron process is to be initiated, a gate voltage VPG21 of the p-channel MOS transistor MP21 is 5V. On the other hand, a gate voltage VPG24 of the p-channel MOS transistor MP24, a gate voltage VNG21 of the n-channel MOS transistor MN21 a the gate voltage VNG22 of the n-channel MOS transistor MN22 are 0V, respectively. Also, a gate voltage VPG25 of the p-channel MOS transistor MP25 is 5V.

At the time $t_1$, the electron discharge signal ESS of 5V is output from the operation control circuit 6. Then, the p-channel MOS transistor MP21 and the n-channel MOS transistor MN21 are turned ON, and the p-channel MOS transistor MP24 and the n-channel MOS transistor MN22 are turned OFF. At this time, a first voltage ($V_{PP}/2$) determined with the p-channel MOS transistors MP21, MP22 and MP23 and the n-channel MOS transistor MN21 is supplied to the gate of the p-channel MOS transistor MP25. When the power source voltage is 12V, a voltage of 6V is supplied. Then, the load characteristics of the source voltage control circuit 10a becomes the same as the first load characteristics shown in FIG. 8. Also, the voltage $V_{PP}$ as the control voltage $V_{SC}$ is output from the source voltage control circuit 10a. At this time, the source voltage of the memory cell is derived from the intersection a of the curve representing the first load characteristics and the curve representing the source current characteristics of the memory cell.

Next, at a time $t_2$ for initiating verification whether or not discharging electron in the first stage is passed all the memory cells, outputting of the electron discharge signal EES is terminated. Then, the gate voltages of respective transistors become similar to those before the time $t_1$. It should be noted that the source voltage of the memory cell at this time is determined on the basis of the intersection b in FIG. 8. Hereinafter, it is assumed that discharging electron in the first stage is passed in all the memory cells. If it is not passed in all the memory cells, the process from the time $t_1$ is repeated.

At a timing $t_3$ for initiating the second stage of discharging electron, the electron discharge signals EES and EES2 of 5V are output from the operation control circuit 6. Then, only the n-channel MOS transistor MN22 is turned ON. At this time, voltage of 0V is supplied to the gate of the p-channel MOS transistor MP25. Then, the load characteristics of the source voltage control circuit 10a becomes the same as the second load characteristics shown in FIG. 8. Also, the voltage $V_{PP}$ as the control voltage $V_{SC}$ is output from the source voltage control circuit 10a. At this time, the source voltage of the memory cell is derived from the intersection c of the curve representing the second load characteristics and the curve representing the source current characteristics of the memory cell.

Next, at a timing $t_4$ for initiating verification whether or not discharging electron in the second stage is passed in all the memory cells, voltages similar to those upon verification whether discharging electron in the first stage is passed in all the memory cells are output from respective circuits. It should be noted that the source voltage of the memory cell is derived from the intersection d of FIG. 8.

Then, at a timing $t_5$ for terminating verification, the voltages output from respective circuits are similar to those before the time $t_1$. When discharging electron in the second stage is passed in all the memory cells, operation is terminated. When discharging electron in the second stage is not passed in all the memory cells, process from the time $t_3$ is repeated.

In the shown embodiment, similar to the first embodiment, two kinds of load characteristics are provided in the source voltage control circuit 10a. During a term from $t_1$ to $t_2$, the source voltage of the memory cell is derived from the first load characteristics. On the other hand, during a term from $t_3$ to $t_4$, the source voltage of the memory cell is derived from the second load characteristics. Accordingly, the current flowing through the source of the memory cell during the term from $t_1$ to $t_2$ becomes smaller than the current flowing through the source of the memory cell during the term from $t_3$ to $t_4$. Thus, a electric field to be applied to the tunnel film applied at the initial stage of electron discharge can be weakened to restrict fatigue of the tunnel film.

In the shown embodiment, two kinds of voltage are supplied to the gate of the p-channel MOS transistor MP25, and two kinds of load characteristics are provided in the source voltage control circuit 10a. However, in the similar principle, it should be possible to provide greater number of kinds of voltage are supplied, and to provide greater number of load characteristics for the source voltage control circuit 10a. Thus, the voltages applied to the source of the memory cell can be set more strictly.

Figure 12:
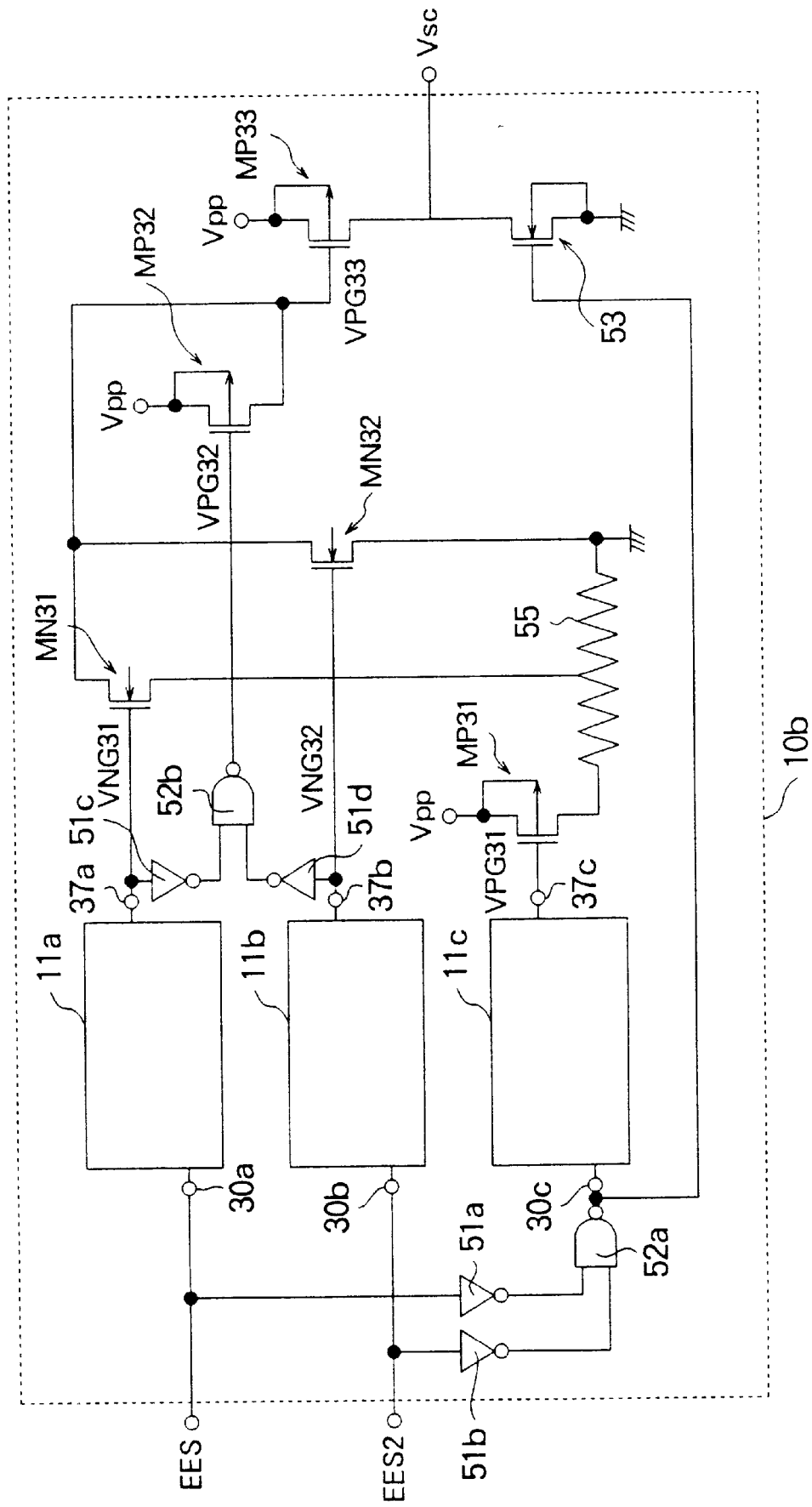
FIG. 12 is a circuit diagram showing the source voltage control circuit provided in the third embodiment of a non-volatile semiconductor memory device according to the present invention.

Next, the third embodiment of the non-volatile semiconductor memory device according to the present invention will be discussed. In the third embodiment, the construction is similar to that of the first embodiment except for the source voltage control circuit. Therefore, discussion for the elements except for the source voltage control circuit will be neglected for keeping the disclosure simple enough to facilitate clear understanding of the present invention. FIG. 12 is a circuit diagram showing the source voltage control circuit provided in the third embodiment of the non-volatile semiconductor memory device according to the present invention. In a source voltage control circuit 10b provided in the third embodiment, a NOT circuit 51a having an input terminal connected to a terminal, to which the electron discharge signal EES is input, and a NOT circuit 51b having an input terminal connected to a terminal, to which the electron discharge signal EES2 is input. Furthermore, a NAND circuit 52a having input terminals connected to respective output terminals of the NOT circuits 51a and 51b is provided. The input terminal 30a of the level shifter circuit 11a is connected to the terminal, to which the electron discharge signal EES is input, and the input terminal 30b of the level shifter circuit 11b is connected to the terminal, to which the electron discharge signal EES2 is input. Also, an input terminal 30c of a level shifter circuit 11c is connected to an output terminal of the NAND circuit 52a. The level shifter circuit 11c has similar construction to those of the level shifters 11a and 11b.

A gate of an n-channel MOS transistor MN31 and an input terminal of a NOT circuit 51c are connected to the first output terminal 37a of the level shifter circuit IIa. On the other hand, a gate of an n-channel MOS transistor MN32 and an input terminal of a NOT circuit 51d are connected the first output terminal 37b of the level shifter circuit 11b. Also, a gate of a p-channel MOS transistor MP31 is connected to a first output terminal 37c of the level shifter circuit 11c. the power source voltage $V_{PP}$ is supplied to a source of the p-channel MOS transistor MP31. A drain of the p-channel MOS transistor MP31 is connected to a resistor element 55. A source of the n-channel MOS transistor MN31 is connected to a mid position of the resistor element 55. A source of the n-channel MOS transistor MN32 and the resistor element 55 are connected to the grounded in common.

Input terminals of a NAND circuit 52b are connected to respective output terminals of the NOT circuits 51c and 51d. A gate of a p-channel MOS transistor MP32 is connected to an output terminal of the NAND circuit 52b. The power source voltage $V_{PP}$ is supplied to a source of the p-channel MOS transistor MP32. Then, a gate of a p-channel MOS transistor MP33 is connected to a drain of the n-channel MOS transistor MN31, a drain of the p-channel MOS transistor MP32 and a drain of the n-channel MOS transistor MN32. the power source voltage $V_{PP}$ is supplied to a source of the p-channel MOS transistor MP33.

On the other hand, a gate of an n-channel MOS transistor 53 is connected to an output terminal of the NAND circuit 52a. A source of the n-channel MOS transistor 53 is grounded. On the other hand, a drain of the n-channel MOS transistor 53 and a drain of the p-channel MOS transistor MP33 are connected to the terminal outputting the control voltage $V_{SC}$.

In the source voltage control circuit 10b constructed as set forth above, also, two kinds of load characteristics are provided. Furthermore, the voltage applied to the gate of the p-channel MOS transistor MP33 is controlled by the level shifter circuits 11a, 11b and 11c. Thus, in the shown embodiment, the level shifters 11a, 11b and 11c function as the gate voltage control circuit.

Figure 13:
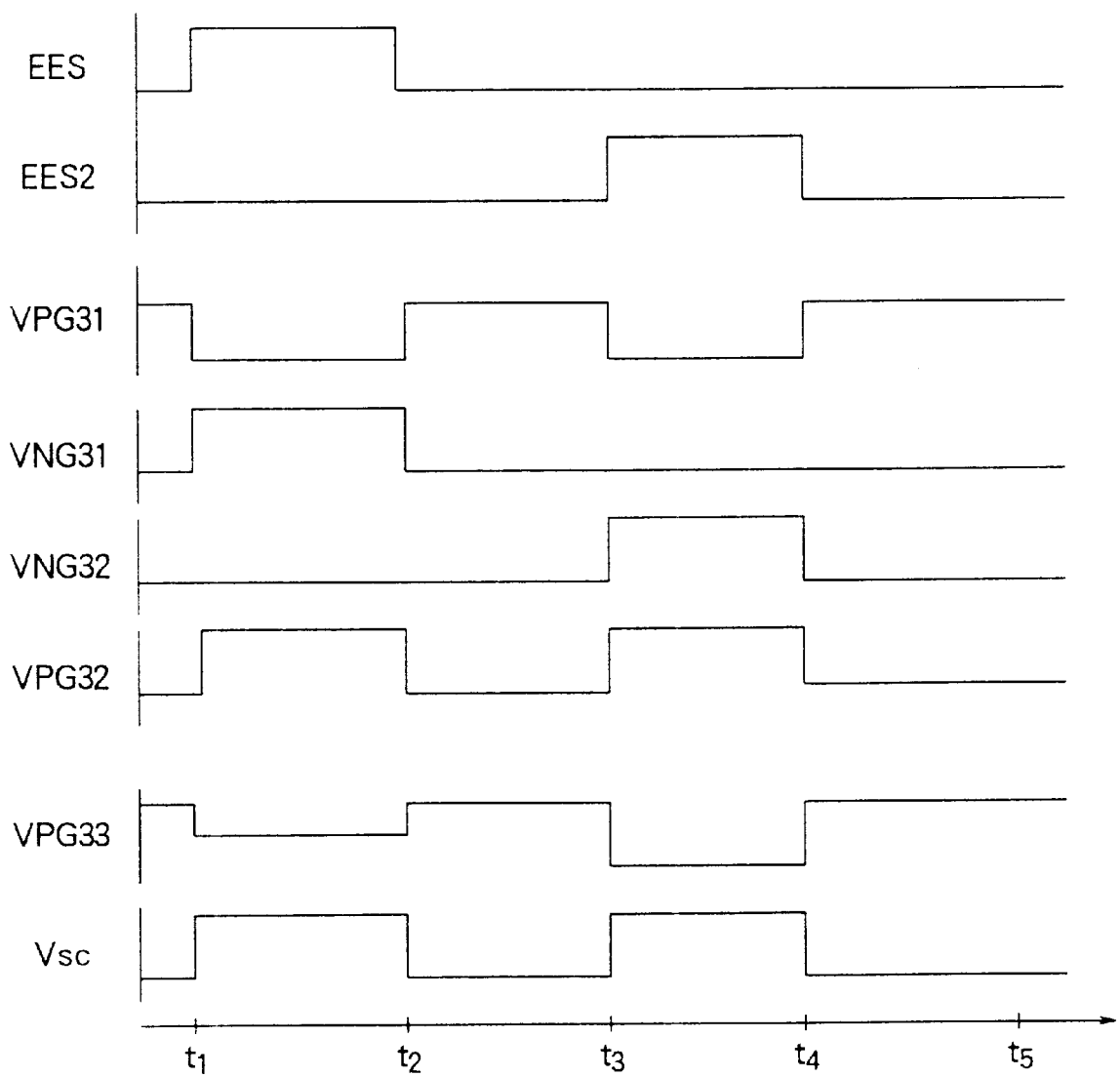
FIG. 13 is a timing chart showing the operation of the third embodiment of the non-volatile semiconductor memory device.

Next, with reference to an accompanying timing chart, operation of the shown embodiment of the source voltage control circuit will be discussed. FIG. 13 is a timing chart showing the operation of the third embodiment of the non-volatile semiconductor memory device according to the present invention. It should be noted that operation of the verification signal EEVS, the expected value data ED, the cell reading data SD, the comparison result signal COMP, the internal address $I_{ad}$ and the verification voltage $V_{ver}$ are similar to those in the first embodiment. Thus, the discussion therefor will be neglected. First, before a time $t_1$ for initiating discharging electron in the first stage, a gate voltage VPG31 of the p-channel MOS transistor MP31 is 5V. On the other hand, a gate voltage VPG32 of the p-channel MOS transistor MP32, a gate voltage VNG31 of the n-channel MOS transistor MN31 and a gate voltage VNG32 of the n-channel MOS transistor MN32 are 0V, respectively. A gate voltage VPG33 of the p-channel MOS transistor MP33 is 5V.

Then, at the time $t_1$ for initiating the first stage of the discharging electron process, the electron discharge signal EES of 5V is output from the operation control circuit 6. Then, the p-channel MOS transistor MP31 and the n-channel MOS transistor MN31 turn ON. At this time, a first voltage is supplied, which is determined by the junction in the resistor element 55 connected to the source of the n-channel MOS transistor MN31, to the gate of the p-channel MOS transistor MP33. If the power source voltage $V_{PP}$ is 12V and a resistance ratio at both sides of the junction is 1:1, a voltage of 6V is supplied to the gate of the p-channel MOS transistor MP33. At this time, the load characteristics of the source voltage control circuit 10b becomes the same as the first load characteristics shown in FIG. 8. Thus, the voltage $V_{PP}$ as the control voltage $V_{SC}$ is output from the source voltage control circuit 10b. At this time, the source voltage of the memory cell is derived on the basis of the intersection a of the curve representing the first load characteristics and the curve representing the source current characteristics of the memory cell.

Next, at a time $t_2$ for initiating verification whether or not discharging electron in the first stage is passed for all the memory cells, outputting of the electron discharge signal EES is terminated. Then, the gate voltage of each transistor becomes the same as that before the time $t_1$. It should be noted that the source voltage of the memory cell at this time is derived on the basis of the intersection b in FIG. 8. Here, discharging electron in the first stage is assumed to be passed in all the memory cells. As long as discharging electron in the first stage is not passed for all the memory cells, the process from the time $t_1$ is repeated.

At a time $t_3$ for initiating the second stage of the discharging electron process, the electron discharge signal EES2 of 5V is output from the operation control circuit 6. Then, the p-channel MOS transistor MP31 and n-channel MOS transistor MN32 are turned ON. At this time, voltage of 0V is supplied to the gate of the p-channel MOS transistor MP33. Then, the load characteristics of the source voltage control circuit 10b is the same as the second load characteristics shown in FIG. 8. The voltage $V_{PP}$ as the control voltage $V_{SC}$ is output from the source control voltage circuit 10b. At this time, the source voltage of the memory cell is derived from the intersection c of the curve representing the second load characteristics and the curve representing the source current characteristics of the memory cell.

Next, at a time $t_4$ for initiating verification whether or not discharging electron in the second stage is passed for all the memory cells, the voltages similar to those before the time $t_1$ are output from respective circuits. At this time, the source voltage of the memory cell is derived from the intersection d in FIG. 8.

Then, at a time $t_5$ for terminating verification, the voltages output from respective circuits are the same as those before the time $t_1$. When discharging electron in the second stage is passed in all the memory cells, operation is terminated, and otherwise, the process from the time $t_3$ is repeated.

In the shown embodiment, similarly to the first embodiment, also, since two kinds of load characteristics of the source voltage control circuit 10b is provided, during the term from $t_1$ to $t_2$, the voltage determined on the basis of the first load characteristics is applied to the source of the memory cell, and during the term from $t_3$ to $t_4$, the voltage determined on the basis of the second load characteristics is applied to the source of the memory cell. Accordingly, the current flowing through the source of the memory cell during the term from $t_1$ to $t_2$ is smaller than the current flowing through the source of the memory cell during the term from $t_3$ to $t_4$. Thus, the electric field applied to the tunnel film at the initial stage of discharging electron process can be weakened to restrict fatigue of the tunnel film.

It should be noted that two kinds of voltages are supplied to the gate of the p-channel MOS transistor MP33, and thus two load characteristics are provided in the source voltage control circuit 10b. However, in the principle, greater number of kinds of voltages may be supplied to provide greater number of load characteristics of the source voltage control circuit 10b. Thus, the voltage to be applied to the source of the memory cell can be set more strictly.

Figure 14:
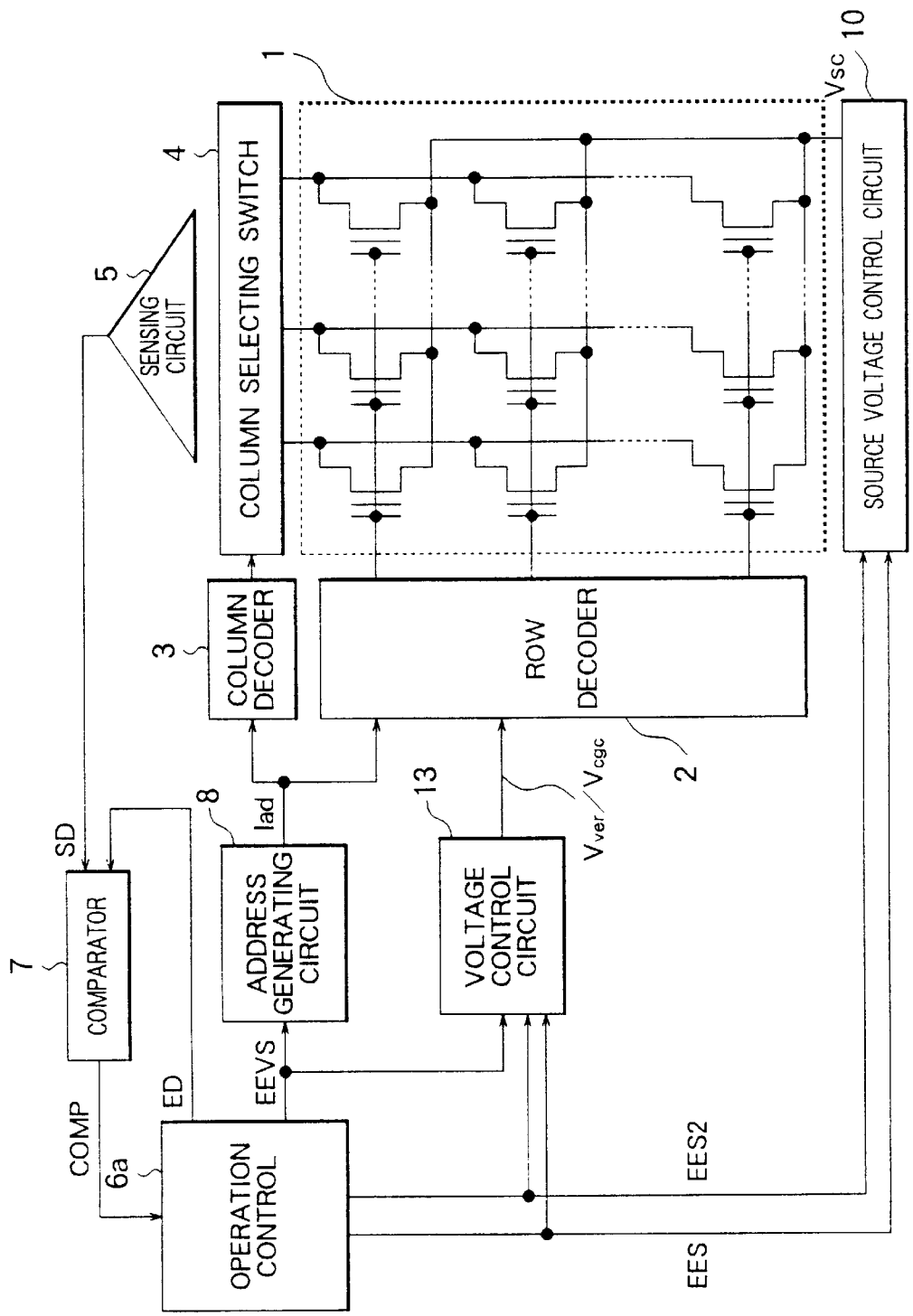
FIG. 14 is a block diagram showing the fourth embodiment of a non-volatile semiconductor memory device according to the present invention.

Next, discussion will be given for the fourth embodiment of the non-volatile semiconductor memory device according to the present invention. FIG. 14 is a block diagram showing the fourth embodiment of a non-volatile semiconductor memory device according to the present invention. In FIG. 14, like components to those in FIG. 5 will be identified by like reference numerals, and detailed description therefor will be neglected for simplification of disclosure. In the shown embodiment, in place of the voltage generating circuit 9 generating only a voltage for verification, a voltage control circuit 13 which can not only generate a voltage for verification but also apply a negative voltage to the control gates of the memory cells in the memory cell array 1. Then, two lines of wiring connecting an operation control circuit 6a, which substitutes for the operation control circuit 6, Find the source voltage control circuit 10 are branched and connected to the voltage control circuit 13.

In the non-volatile semiconductor memory device constructed as set forth above, in the first stage of the discharging electron process, the electron discharge signal EES is output from the operation control circuit dia to the source voltage control circuit 10 and the voltage control circuit 13. Then, the control voltage $V_{CGC}$ applied to the control gate of the memory cell is generated according to the electron discharge signal EES in the voltage control circuit 13 and output to the row decoder 2. It should be noted that the control voltage $V_{CGC}$ is a negative voltage.

In the second stage of the discharging electron process, the electron discharge signal EES2 is output from the operation control circuit 6a to the source voltage control circuit 10 and the voltage control circuit 13. Then, similarly to the first stage, the control voltage $V_{CGC}$ is generated based on the electron discharge signal EES2 in the voltage control circuit 13, and output to the row decoder 2.

In the shown embodiment, the source voltage in the initial stage of the discharging electron process can be lowered to restrict fatigue of the tunnel film.

It should be noted that, while discussion has been given for application of the construction to apply the negative voltage to the control gate of the memory cell in the discharging electron process to the first embodiment of the non-volatile semiconductor memory device, the construction is also applicable for the second and third embodiments. Namely, it is possible to replace the source voltage control circuit 10 with the source voltage control circuit 10a or 10b.

Figure 15:
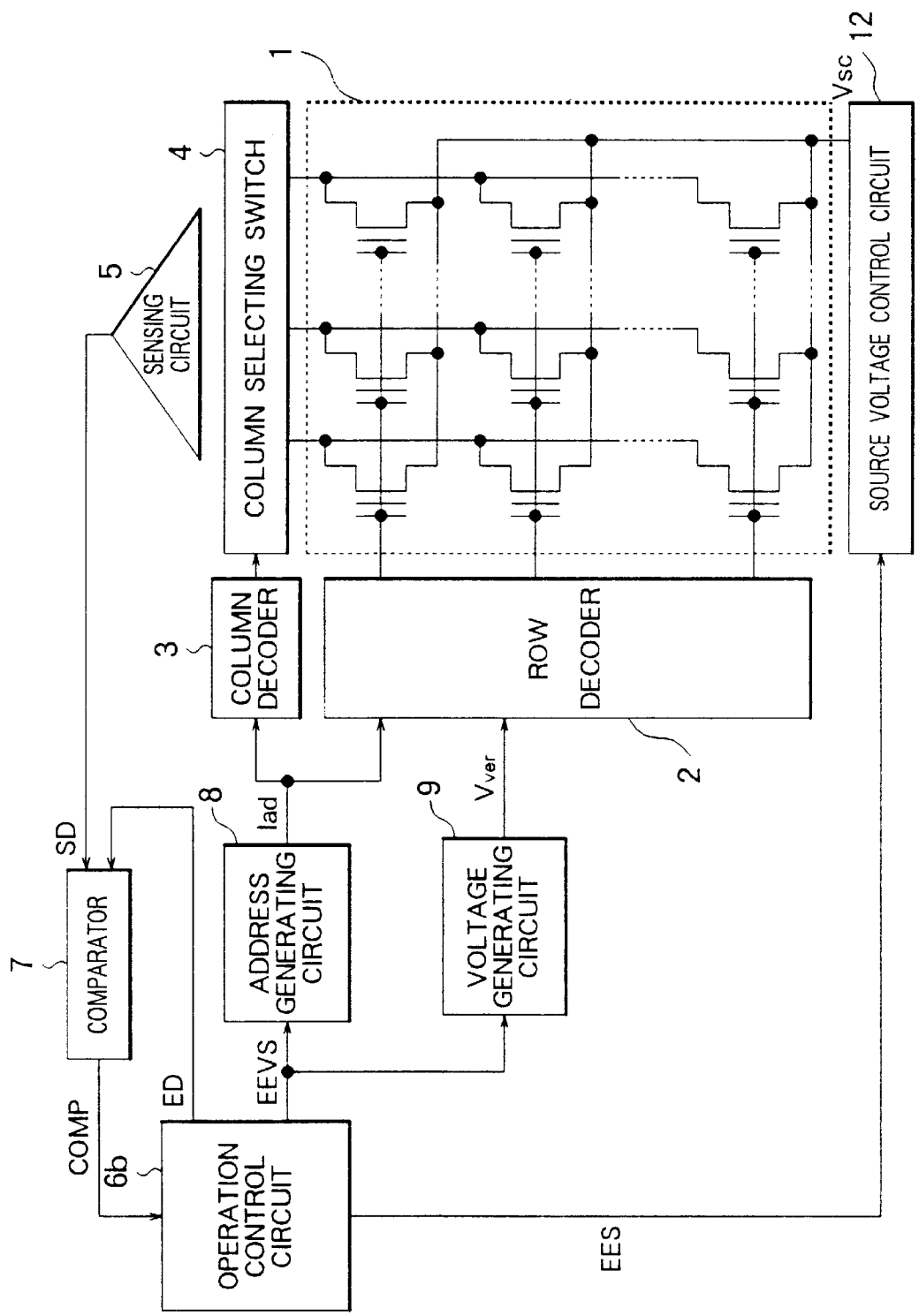
FIG. 15 is a block diagram showing the fifth embodiment of a non-volatile semiconductor memory device according to the present invention.

Next, the fifth embodiment of a non-volatile semiconductor memory device according to the present invention will be discussed. FIG. 15 is a block diagram showing the fifth embodiment of the non-volatile semiconductor memory device according to the present invention. In FIG. 15, the like components to those in FIG. 5 are identified by like reference numerals, and detailed description therefor will be neglected. In the shown embodiment, an operation control circuit 6b, which substitutes for the operation control circuit 6, and a source voltage control circuit 12 are connected with a single line of wiring. In the shown embodiment, only the electron discharge signal EES is output from the operation control circuit 6b to the source voltage control circuit 12.

Figure 16:
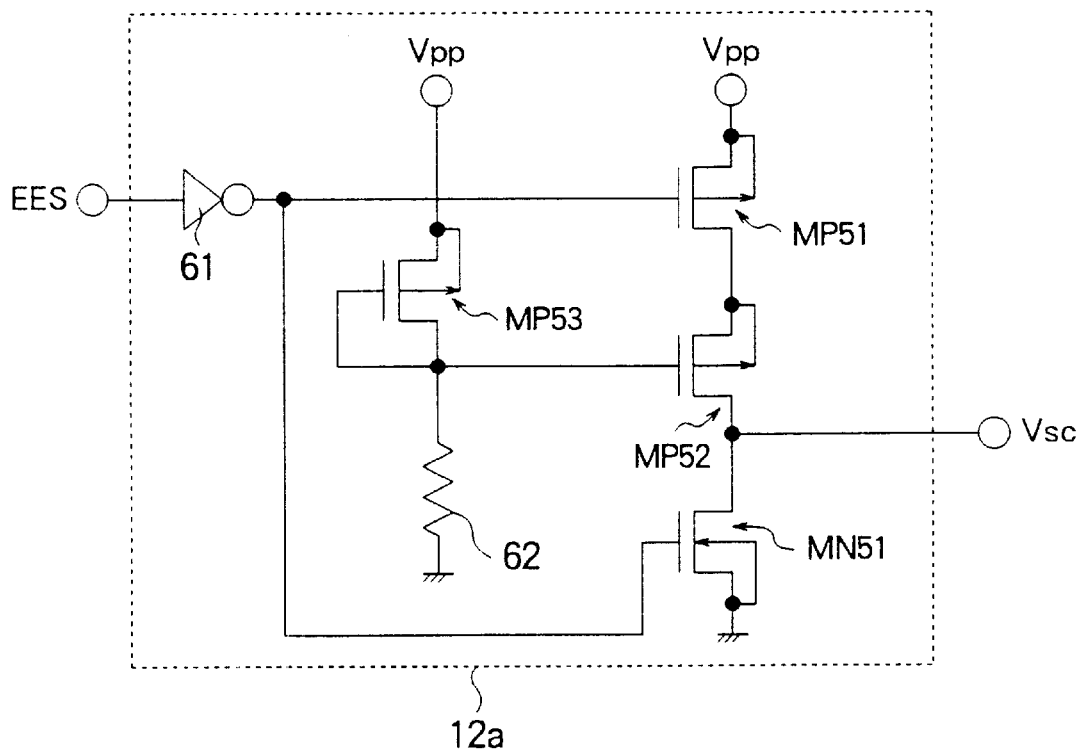
FIG. 16 is a circuit diagram showing the source voltage control circuit provided in the fifth embodiment of the non-volatile semiconductor memory device.

FIG. 16 is a circuit diagram showing the source voltage control circuit provided in the fifth embodiment of the non-volatile semiconductor memory device according to the present invention. In the source voltage control circuit 12, an input terminal of a NOT circuit 61 is connected to the terminal, to which the electron discharge signal EES is input. A gate of a p-channel MOS transistor MP1 is connected to an output terminal of the NOT circuit 61. The power source voltage $V_{PP}$ is supplied to a source of the p-channel MOS transistor MP51. A source of a p-channel MOS transistor MP52 is connected to a drain of the p-channel MOS transistor MP51.

A drain and a gate of a p-channel MOS transistor MP53 are connected to a gate of the p-channel MOS transistor MP52 and one terminal of a resistor element 62. The other terminal of the resistor element 62 is grounded. the power source voltage $V_{PP}$ is supplied to a source of the p-channel MOS transistor MP53.

A gate of the n-channel MOS transistor MN51 is connected to the output terminal of the NOT circuit 61. A source of the n-channel MOS transistor MN51 is grounded. Then, a drain of the n-channel MOS transistor MN51 and a drain of the p-channel MOS transistor MP52 are connected to the terminal, through which the control voltage $V_{SC}$ is output.

In the shown embodiment, a voltage determined by the p-channel MOS transistor MP53 and the resistor element 62 is applied to the gate of the p-channel MOS transistor MP52. It should be noted that the voltage is a voltage between the grounding potential and the power source voltage $V_{PP}$. The gate voltage of the p-channel MOS transistor MP52 is controlled by the p-channel MOS transistor MP53 and the resistor elements 62. Thus, the p-channel MOS transistor MP53 and the resistor element 62 serves as the gate voltage control circuit.

Figure 17:
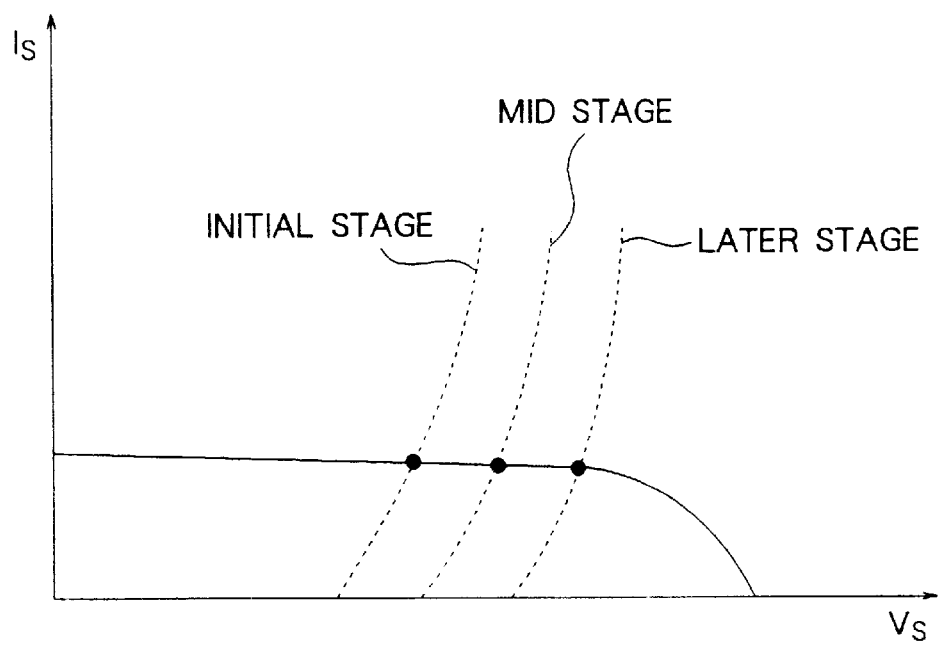
FIG. 17 is a graph showing the load characteristics of the source voltage control circuit provided in the fifth embodiment of the non-volatile semiconductor memory device.

FIG. 17 is a graph showing the load characteristics of the source voltage control circuit provided in the fifth embodiment with taking a voltage output to the source of the memory cell on the horizontal axis and a current output to the source on the vertical axis. In FIG. 17, the solid line represents the load characteristics of the source voltage control circuit 12, and the broken line represents the source current characteristics of the memory cell. In the shown embodiment, in the region lower than or equal to a specific value, the current value of the load characteristics is always low and constant. The source current characteristics falls substantially within the foregoing region. Accordingly, a electric field to be applied to the tunnel film of the memory cell can be weakened to restrict fatigue of the tunnel film.

On the other hand, in the shown embodiment, without providing any depletion type n-channel MOS transistor, the source current at the initial stage of the discharging electron process and the source current at later stage are substantially the same. Therefore, in fabrication of the non-volatile semiconductor memory device, a large number of process steps as required in the prior art become unnecessary.

Figure 18:
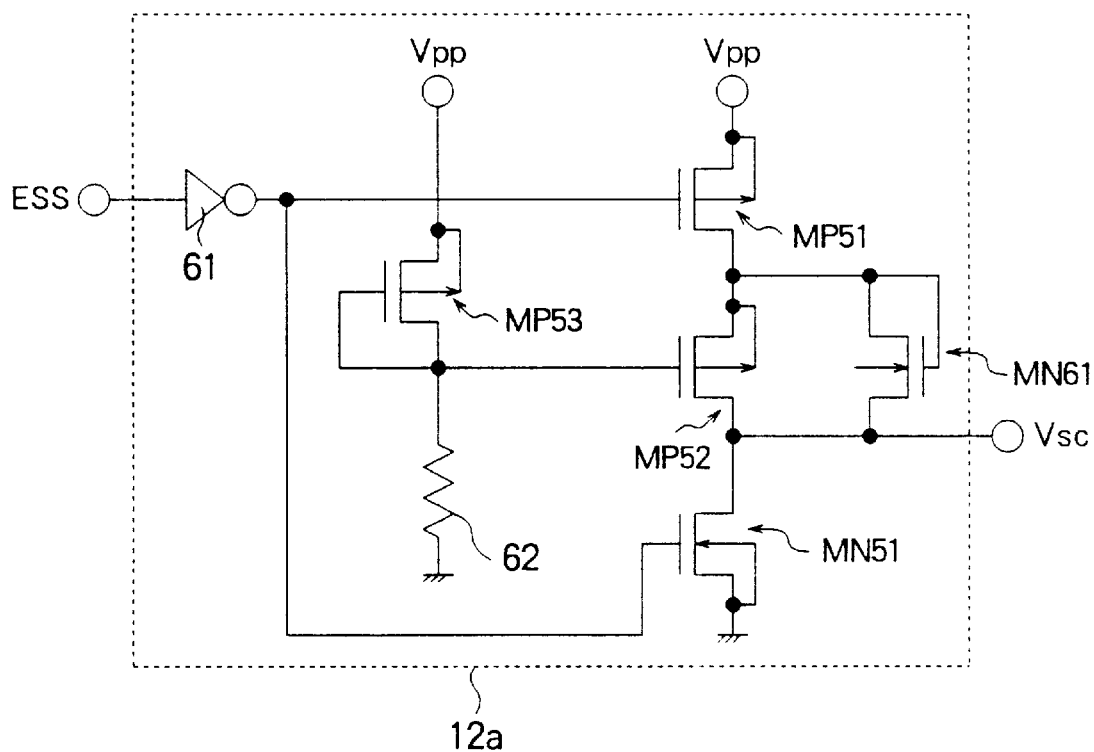
FIG. 18 is a circuit diagram showing the source voltage control circuit provided in the sixth embodiment of a non-volatile semiconductor memory device according to the present invention.

Next, discussion will be given with respect to the sixth embodiment of a non-volatile semiconductor memory device according to the present invention. In the sixth embodiment, the construction except for the source voltage control circuit is the same as those in the fifth embodiment. Description of those elements will be neglected for simplicity of disclosure. FIG. 18 is a circuit diagram showing the source voltage control circuit provided in the sixth embodiment of the non-volatile semiconductor memory device according to the present invention. It should be noted that, in FIG. 18, like components to those in FIG. 16 will be identified by like reference numerals, and discussion therefor will be neglected. In the source voltage control circuit 12a provided in the sixth embodiment, a gate and a drain of an enhanced type n-channel MOS transistor MN61 are connected to the drain of the p-channel MOS transistor MP51 and the source of the p-channel MOS transistor MP52. Also, a source of the n-channel MOS transistor MN61 is connected to the drain of the n-channel MOS transistor MN51 and the drain of the p-channel MOS transistor MP52.

Figure 19:
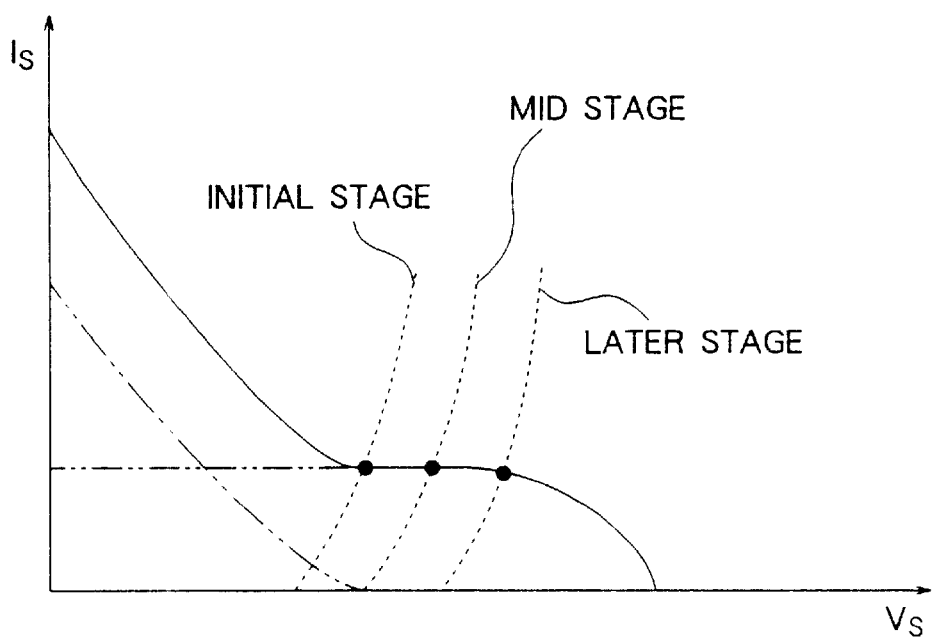
FIG. 19 is a graph showing the load characteristics of the source voltage control circuit provided in the sixth embodiment of the non-volatile semiconductor memory device.

FIG. 19 is a graph showing the load characteristics of the source voltage control circuit provided in the sixth embodiment with taking a voltage output to the source of the memory cell on the horizontal axis and a current output to the source on the vertical axis. In FIG. 19, the solid line represents the load characteristics of the source voltage control circuit 12a, the broken line represents the source current characteristics of the memory cell, and one dotted line represents load characteristics of the n-channel MOS transistor MN61. The load characteristics of the source voltage control circuit 12a in the shown embodiment is expressed as a combination of the load characteristics of the source voltage control circuit provided in the fifth embodiment and the load characteristics of the n-channel MOS transistor MN61. The load characteristics of the n-channel MOS transistor MN61 influences the load characteristics of the source voltage control circuit 12a in the region where the voltage is low, whereas it does not influence in a region where the voltage is high. On the other hand, the source current characteristics of the memory cell is present in a relatively high voltage region. Therefore, the source current characteristics of the memory cell is not influenced by the n-channel MOS transistor MN61, and, similarly to the fifth embodiment, the current flowing through the source of the memory cell in the initial stage of the discharging electron process is suppressed. Also, a period from outputting of the electron discharge signal EES to initiation of discharging electron can be shortened.

According to the shown embodiment, the electric field to be applied to the tunnel film of the memory cell can be weakened to restrict fatigue of the tunnel film. In comparison with the fifth embodiment, the period to initiation of discharging electron can be shortened.

Figure 20:
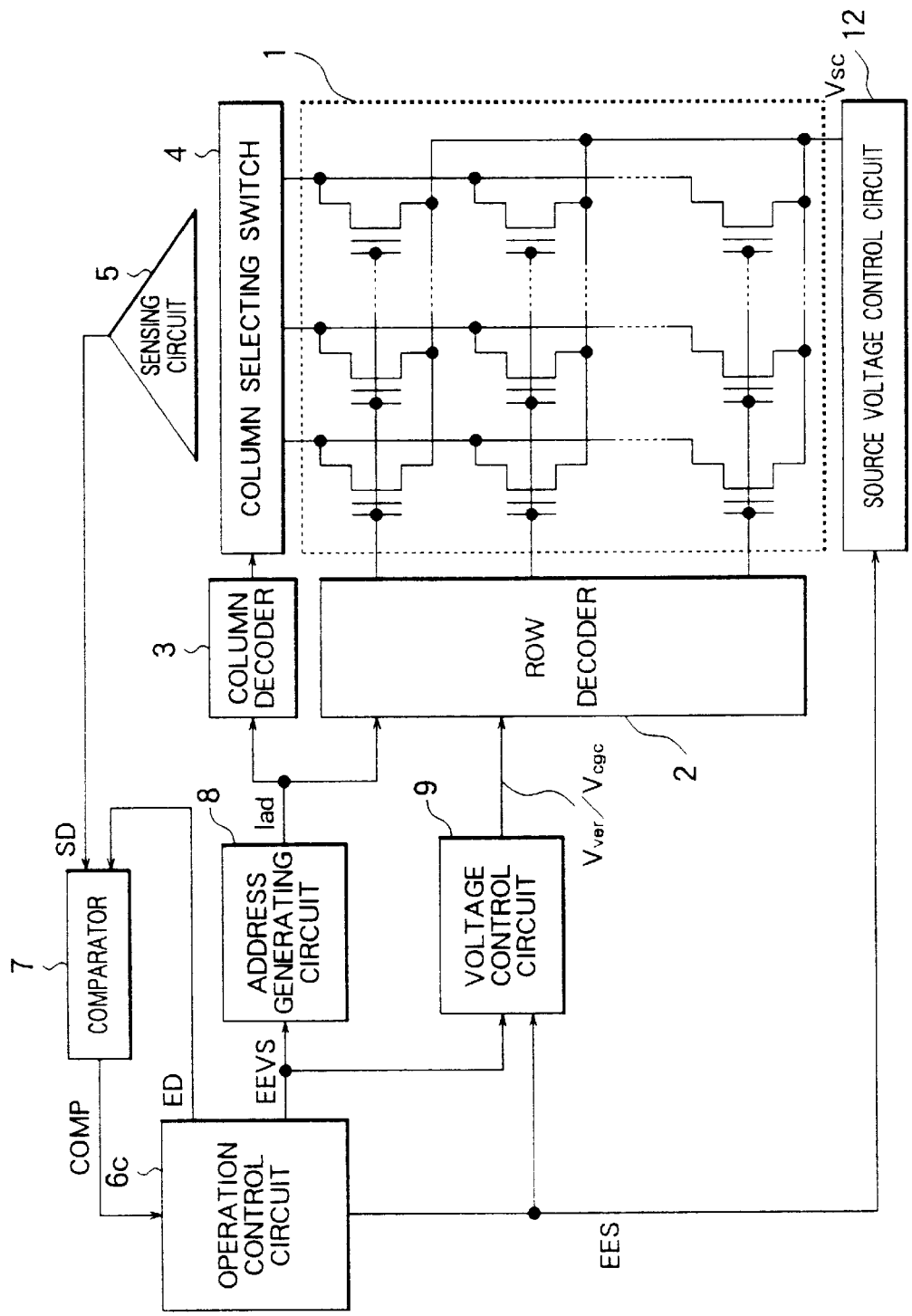
FIG. 20 is a block diagram showing the seventh embodiment of a non-volatile semiconductor memory device according to the present invention.

Next, the seventh embodiment of a non-volatile semiconductor memory device according to the present invention will be discussed. FIG. 20 is a block diagram showing the seventh embodiment of the non-volatile semiconductor memory device according to the present invention. In FIG. 20, like components to those in FIG. 15 will be identified by like reference numerals and detailed discussion therefor will be neglected. In the shown embodiment, in place of the voltage generating circuit 9 generating only a voltage for verification, the voltage control circuit 13 is provided, which can not only generate a voltage for verification, but also apply a negative voltage to the control gate of the memory cell in the discharging electron process.

In the non-volatile semiconductor memory device constructed as set forth above, in the discharging electron process, the electron discharge signal EES is output from an operation control circuit 6c, which substitutes for the operation control circuit 6a, to the source voltage control circuit 12 and the voltage control circuit 13. Then, the control voltage $V_{CGC}$ to be applied to the control gate of the memory cell is generated on the basis of the electron discharge signal EES in the voltage control circuit 13 to be output to the row decoder 2. The control voltage $V_{CGC}$ is negative voltage.

In the shown embodiment, also, the source voltage in the initial stage of the discharging electron process can be lowered to restrict fatigue of the tunnel film.

It should be noted that, while discussion has been given for application of the construction to apply the negative voltage to the control gate of the memory cell upon discharging of electron to the fifth embodiment of the non-volatile semiconductor memory device, it is also applicable for the sixth embodiment. Namely, the source voltage control circuit 12 may be replaced with the source voltage control circuit 12a.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the features set out in the appended claims.

What is claimed is:

1. A non-volatile semiconductor memory device comprising:
    a memory cell,
        which includes
            a control gate;
            a floating gate;
            an insulating film insulating between said control gate and said floating gate;
            a source; and
            a tunnel film insulating between said floating gate and said source,
        in which data is to be stored by charging electron in said floating gate, and
        from which data is to be erased by discharging electron charged in said floating gate; and
    a source voltage control circuit connected to said source, said source voltage control circuit having a plurality of load characteristics for selecting specific load characteristics from said plurality of load characteristics for controlling a voltage of said source when electron charged in said floating gate is discharged; and
    a voltage control circuit supplying a controlled voltage to said control gate of said memory cell, wherein said voltage to be supplied to said control gate of said memory cell is a negative voltage.

2. A non-volatile semiconductor memory device comprising:
    a memory cell,
        which includes
            a control gate:
            a floating gate;
            an insulating film insulating between said control gate and said floating gate;
            a source; and
            a tunnel film insulating between said floating gate and said source,
        in which data is to be stored by charging electrons in said floating gate,
        from which data is to be erased by discharging electrons charged in said floating gate; and
    a source voltage control circuit connected to said source, said source voltage control circuit controlling a voltage of said source when electrons charged in said floating gate are discharged, without a depletion type n-channel MOS transistor, wherein a current flowing through said source in initial stage of erasing data from said memory cell is substantially equal to a current flowing through said source in later stage of erasing data from said memory cell,
    wherein:
        said source voltage control circuit has a plurality of p-channel MOS transistors,
        one of a plurality of said p-channel MOS transistors is a first p-channel MOS transistor having a gate, to which a signal indicating whether electrons charged in said floating gate of said memory cell are to be discharged or not is to be input,
        another of a plurality of said p-channel MOS transistors is a second p-channel MOS transistor connected to said first p-channel MOS transistor in series and having a gate,
        said source voltage control circuit includes a gate control circuit applying a voltage between a grounding potential and a power source voltage to said gate of said second p-channel MOS transistor,
        said first p-channel MOS transistor has a source connected to a power source, and a drain,
        said second p-channel MOS transistor has a source connected to said drain of said first p-channel MOS transistor, and a drain connected to said source of said memory cell, and
        said gate voltage control circuit includes
            a third p-channel MOS transistor having a drain and a source connected to said gate of said second p-channel MOS transistor, and a source connected to a power source; and a resistor element having one terminal connected to said drain of said third p-channel MOS transistor and the other terminal connected to the grounding potential.

3. A non-volatile semiconductor memory device as set forth in claim 2, wherein said source voltage control circuit includes
an enhanced type n-channel MOS transistor having
a drain and a gate connected to said source of said second p-channel MOS transistor; and
a source connected to said drain of said second p-channel MOS transistor.

4. A non-volatile semiconductor memory device comprising:
a memory cell,
which includes
a control gate;
a floating gate;
an insulating film insulating between said control gate and said floating gate;
a source; and
a tunnel film insulating between said floating rate and said source,
in which data is to be stored by charging electron in said floating gate;
from which data is to be erased by discharging electron charged in said floating gate; and
a source voltage control circuit connected to said source, said source voltage control circuit controlling a voltage of said source when electron charged in said floating gate is discharged, without a depletion type n-channel MOS transistor, wherein a current flowing through said source in initial stage of erasing data from said memory cell is substantially equal to a current flowing through said source in later stage of erasing data from said memory cell; and
a voltage control circuit supplying a controlled voltage to said control gate of said memory cell, wherein said voltage to be supplied to said control gate of said memory cell is a negative voltage.

5. A non-volatile semiconductor memory device comprising:
a memory cell,
which includes
a control gate;
a floating gate;
an insulating film insulating between said control gate and said floating gate;
a source; and
a tunnel film insulating between said floating gate and said source,
in which data is to be stored by charging electron in said floating gate,
from which data is to be erased by discharging electron charged in said floating gate; and
a source voltage control circuit connected to said source, said source voltage control circuit comprising
a first p-channel MOS transistor comprising:
a gate, to which a signal indicating whether electron charged in said floating gate of said memory cell is to be discharged or not is to be input;
a source, connected to said power source; and
a drain;
a second p-channel MOS transistor connected to said first p-channel MOS transistor in series and comprising:
a gate;
a source, connected to said drain of said first p-channel MOS transistor; and
a drain, connected to said source of said memory cell;
a gate control circuit applying a voltage between a grounding potential and a power source voltage to said gate of said second p-channel MOS transistor, said gate control circuit comprising:
a third p-channel MOS transistor having a drain and a gate connected to said gate of said second p-channel MOS transistor, and a source connected to a power source; and
a resistor element having one terminal connected to said drain of said third p-channel MOS transistor and the other terminal connected to the ground; and
no depletion type n-channel MOS transistor.

6. A non-volatile semiconductor memory device as set forth in claim 5, wherein said source voltage control circuit includes an enhanced type n-channel MOS transistor having
a drain and a gate connected to said source of said second p-channel MOS transistor; and
a source connected to said drain of said second p-channel MOS transistor.

7. A non-volatile semiconductor memory device as set forth in claim 5, wherein said voltage to be supplied to said control gate of said memory cell is a negative voltage.

* * * * *